US011309925B2

(12) United States Patent
Matsumoto et al.

(10) Patent No.: US 11,309,925 B2
(45) Date of Patent: Apr. 19, 2022

(54) RADIO-FREQUENCY MODULE, TRANSMISSION POWER AMPLIFIER, AND COMMUNICATION APPARATUS

(71) Applicant: Murata Manufacturing Co., Ltd., Nagaokakyo (JP)

(72) Inventors: Sho Matsumoto, Nagaokakyo (JP); Takanori Uejima, Nagaokakyo (JP); Yuji Takematsu, Nagaokakyo (JP); Tetsuro Harada, Nagaokakyo (JP); Dai Nakagawa, Nagaokakyo (JP); Naoya Matsumoto, Nagaokakyo (JP); Yutaka Sasaki, Nagaokakyo (JP); Yuuki Fukuda, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/224,154

(22) Filed: Apr. 7, 2021

(65) Prior Publication Data

US 2021/0226652 A1     Jul. 22, 2021

Related U.S. Application Data

(63) Continuation of application No. PCT/JP2019/041388, filed on Oct. 21, 2019.

(30) Foreign Application Priority Data

Nov. 2, 2018  (JP) .............................. JP2018-207003

(51) Int. Cl.
*H04B 1/04* (2006.01)
*H04B 1/44* (2006.01)

(52) U.S. Cl.
CPC ......... *H04B 1/0458* (2013.01); *H04B 1/0475* (2013.01); *H04B 1/44* (2013.01); *H04B 2001/0408* (2013.01)

(58) Field of Classification Search
CPC ... H04B 1/38; H04B 1/40; H04B 1/44; H04B 1/0475; H04B 1/0458; H04B 2001/0408; H04L 25/00; H04L 67/12
See application file for complete search history.

(56) References Cited

U.S. PATENT DOCUMENTS

| 2013/0012283 A1 | 1/2013 | Thomas |
| 2018/0096949 A1 | 4/2018 | Chen et al. |

(Continued)

FOREIGN PATENT DOCUMENTS

| CN | 1442902 A | 9/2003 |
| CN | 1839554 A | 9/2006 |

(Continued)

OTHER PUBLICATIONS

Chinese Office Action dated Jan. 10, 2022, in corresponding Chinese Patent Application No. 201980071952.3.

(Continued)

*Primary Examiner* — Thanh C Le
(74) *Attorney, Agent, or Firm* — Xsensus LLP

(57) ABSTRACT

A radio-frequency module includes a mounting substrate having a first main surface and a second main surface on opposite sides of the mounting substrate; an external connection terminal arranged on the first main surface; and a first transmission power amplifier arranged on the first main surface. The first transmission power amplifier includes an amplifier first main surface closest to the first main surface, an amplifier second main surface that faces away from the amplifier first main surface, a first input-output electrode arranged on the amplifier first main surface and through which a radio-frequency signal input into the first transmission power amplifier or a radio-frequency signal output from (Continued)

the first transmission power amplifier is transmitted, and a first ground electrode arranged on the amplifier second main surface.

20 Claims, 7 Drawing Sheets

(56) References Cited

U.S. PATENT DOCUMENTS

| | | | | |
|---|---|---|---|---|
| 2020/0203291 | A1* | 6/2020 | Uejima | H03F 3/68 |
| 2021/0219419 | A1* | 7/2021 | Takematsu | H03H 9/72 |
| 2021/0367627 | A1* | 11/2021 | Yamaguchi | H04B 1/0057 |
| 2021/0375838 | A1* | 12/2021 | Goto | H01L 25/16 |
| 2021/0399699 | A1* | 12/2021 | Hanaoka | H05K 1/181 |
| 2021/0399758 | A1* | 12/2021 | Yamaguchi | H04B 1/40 |

FOREIGN PATENT DOCUMENTS

| | | |
|---|---|---|
| JP | 2000-31331 A | 1/2000 |
| JP | 2003-124435 A | 4/2003 |
| JP | 2004-128288 A | 4/2004 |
| JP | 2011-40602 A | 2/2011 |
| JP | 2018-98677 A | 6/2018 |
| WO | 2006/035518 A1 | 4/2006 |
| WO | 2009/122835 A1 | 10/2009 |
| WO | 2018/043162 A1 | 3/2018 |
| WO | 2018/110513 A1 | 6/2018 |

OTHER PUBLICATIONS

International Search Report and Written Opinion dated Dec. 10, 2019, received for PCT Application PCT/JP2019/041388, Filed on Oct. 21, 2019, 8 pages including English Translation.
Translation of Written Opinion received for PCT Application PCT/JP2019/041388, Filed Oct. 21, 2019.

* cited by examiner

RADIO-FREQUENCY MODULE, TRANSMISSION POWER AMPLIFIER, AND COMMUNICATION APPARATUS

CROSS-REFERENCE TO RELATED APPLICATIONS

The present application is a continuation of and claims priority to PCT/JP2019/041388, filed Oct. 21, 2019, which claims priority to JP 2018-207003, filed Nov. 2, 2018, the entire contents of each are incorporated herein by its reference.

BACKGROUND

1. Field

The present disclosure relates to a radio-frequency module, a transmission power amplifier, and a communication apparatus.

2. Description of the Related Art

In mobile communication apparatuses, such as mobile phones, the numbers of circuit elements composing radio-frequency front-end circuits are increased particularly along with the development of multiband technologies.

Japanese Unexamined Patent Application Publication No. 2011-40602 discloses a semiconductor module (radio-frequency, RF, module) having multiple electronic components mounted on both faces of a wiring substrate. More specifically, a semiconductor chip composing a power amplifier (transmission power amplifier) is mounted on the main surface at an external substrate (mounting substrate printed circuit board (PCB)) side. It is considered that the above configuration realizes reduction in size, high reliability, and improvement of mounting strength and mounting reliability.

In the semiconductor module (radio-frequency module) described in Japanese Unexamined Patent Application Publication No. 2011-40602, a bonding wire is connected at the top face side of the semiconductor chip composing the power amplifier (transmission power amplifier) and radio-frequency signals are input and output through the bonding wire. In addition, a ground electrode is formed at a rear face side of the semiconductor chip, and the power amplifier is ground-connected to the external substrate (mounting substrate PCB) with the ground electrode via the wiring substrate.

However, since a ground path to the external substrate passes a high-resistance plane wiring pattern along the mounting face of the wiring substrate when the power amplifier is grounded via the wiring substrate, there is a problem in that thermal resistance is increased to reduce heat dissipation.

SUMMARY

Accordingly, in light of the above and other deficiencies in conventional devices, a compact radio-frequency module is described herein that has improved heat dissipation from a transmission power amplifier, the transmission power amplifier, and a communication apparatus.

A radio-frequency module includes a mounting substrate having a first main surface and a second main surface on opposite sides of the mounting substrate; an external connection terminal arranged on the first main surface; and a first transmission power amplifier arranged on the first main surface. The first transmission power amplifier includes an amplifier first main surface closest to the first main surface, an amplifier second main surface that faces away from the amplifier first main surface, a first input-output electrode arranged on the amplifier first main surface and through which a radio-frequency signal input into the first transmission power amplifier or a radio-frequency signal output from the first transmission power amplifier is transmitted, and a first ground electrode arranged on the amplifier second main surface A transmission power amplifier according to an embodiment of the present disclosure includes an amplifier first main surface and an amplifier second main surface on opposites sides of the transmission power amplifier from one another, a first input-output electrode which is connected to the amplifier first main surface and through which a radio-frequency signal input into the transmission power amplifier or a radio-frequency signal output from the transmission power amplifier is transmitted, a second input-output electrode which is connected to the amplifier second main surface and through which a radio-frequency signal input into the transmission power amplifier or a radio-frequency signal output from the transmission power amplifier is transmitted, and a ground electrode arranged on the amplifier second main surface.

According to the present disclosure, it is possible to provide a compact radio-frequency module having improved heat dissipation from a transmission power amplifier, the transmission power amplifier, and a communication apparatus.

Other features, elements, characteristics and advantages of the present disclosure will become more apparent from the following detailed description of preferred embodiments of the present disclosure (with reference to the attached drawings).

DESCRIPTION OF THE EMBODIMENTS

Figure 1:
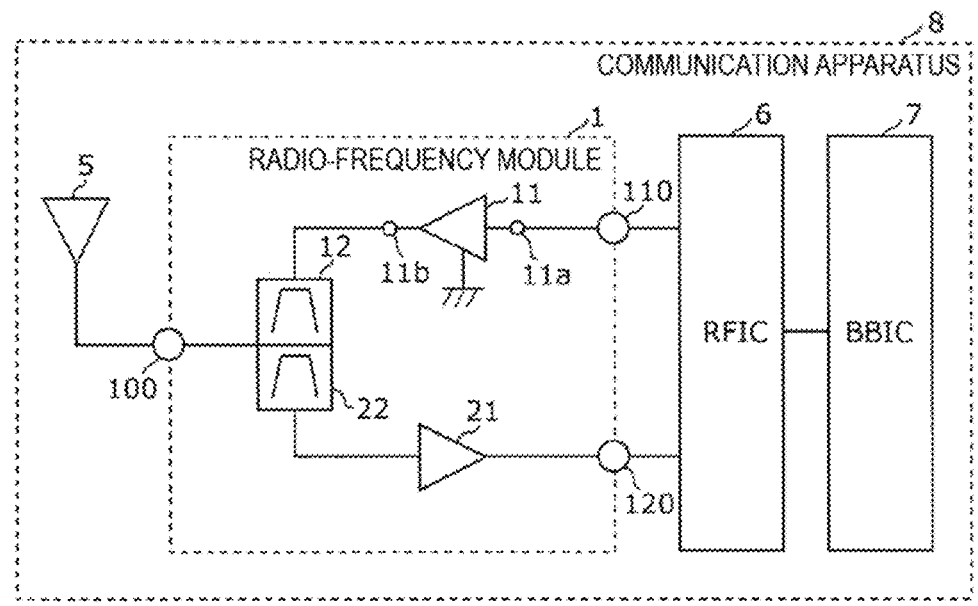
FIG. 1 is a circuit configuration diagram of a radio-frequency module (or RF front-end circuitry) and a communication apparatus according to a first embodiment.

Embodiments of the present disclosure will herein be described in detail using examples with reference to the drawings. All the embodiments described below indicate comprehensive or specific examples. Numerical values, shapes, materials, components, the arrangement of the components, the connection mode of the components, and so on, which are indicated in the embodiments described below, are only examples and are not intended to limit the present disclosure. Among the components in the embodiments described below, the components that are not described in the independent claims are described as optional components. In addition, the sizes or the ratios of the sizes of the components illustrated in the drawings are not necessarily strictly indicated. Furthermore, as used herein the terms "circuit" or "circuitry" means one or more circuits, including discrete circuit(s) as well as circuit board(s) and combinations thereof.

In the examples and modifications described below, "A is connected to B" is defined as (1) A is directly in contact with B or (2) A is in contact with B with a conductor film interposed therebetween (A and B are in contact with the front face and the rear face of the conductor film). In addition, "A is electrically connected to B" is not necessarily defined as direct connection between A and B and is defined as inclusion of indirect connection between A and B with a conductive line interposed therebetween.

In the examples and the modifications described below, "C is arranged between A and B in a plan view of a substrate (or the main surface of the substrate)" when A, B, and C are mounted on the substrate is defined as overlapping of at least part of the area of C projected in a plan view of the substrate with a line connecting an arbitrary point in the area of A projected in a plan view of the substrate to an arbitrary point in the area of B projected in a plan view of the substrate.

First Embodiment

[1.1 Circuit Configuration of Radio-Frequency Module 1 and Communication Apparatus 8]

FIG. 1 is a circuit configuration diagram of a radio-frequency module 1 and a communication apparatus 8 according to a first embodiment. Referring to FIG. 1, the communication apparatus 8 includes the radio-frequency module 1, an antenna element 5, a radio-frequency (RF) signal processing circuit (radio-frequency integrated circuit (RFIC)) 6, and a baseband signal processing circuit (baseband integrated circuit (BBIC)) 7. In this exemplary configuration the communication device is a multi-band transceiver. As used in this specification the term "module", as used with "radio frequency module", or "RF front-end module" should be construed as circuitry (programmable, as well as discrete) and associated circuit components, such as circuit boards, RF shielding, etc.

The RFIC 6 is an RF signal processing circuit that processes radio-frequency signals transmitted and received through the antenna element 5. Specifically, the RFIC 6 performs signal processing, such as down-conversion, of a radio-frequency reception signal input through a reception signal path (a path composed of a reception filter 22, a low noise amplifier (LNA) 21, and a reception output terminal 120) of the radio-frequency module 1 and supplies a reception signal resulting from the signal processing to the BBIC 7. In addition, the RFIC 6 performs signal processing, such as up-conversion, of a transmission signal supplied from the BBIC 7 and outputs a radio-frequency transmission signal resulting from the signal processing to a transmission signal path (a path composed of a transmission input terminal 110, a power amplifier (PA) 11, and a transmission filter 12) of the radio-frequency module 1.

The BBIC 7 performs the signal processing using an intermediate frequency band lower than the frequency band of the radio-frequency signal propagated in the radio-frequency module 1. The signal processed in the BBIC 7 is used as, for example, an image signal for image display or an audio signal for talking with a speaker.

The antenna element 5 is connected to a common terminal 100 of the radio-frequency module 1. The antenna element 5 radiates the radio-frequency signal output from the radio-frequency module 1 and receives the radio-frequency signal from the outside of the communication apparatus 8 to supply the received radio-frequency signal to the radio-frequency module 1.

In the communication apparatus 8 according to the first embodiment, the antenna element 5 and the BBIC 7 are not essential components.

The configuration of the radio-frequency module 1 will now be described.

Referring to FIG. 1, the radio-frequency module 1 includes the common terminal 100, the transmission input terminal 110, the reception output terminal 120, the PA 11, the LNA 21, the transmission filter 12, and the reception filter 22.

The common terminal 100 is connected to the antenna element 5.

The PA 11 is a first transmission power amplifier that has an input electrode 11a and an output electrode 11b and that preferentially amplifies the radio-frequency signal, for example, in a first communication band.

The LNA 21 is a reception low noise amplifier that preferentially amplifies the radio-frequency signal, for example, in the first communication band with low noise.

Each of the PA 11 and the LNA 21 is composed of, for example, a complementary metal oxide semiconductor (CMOS), a field effective transistor (FET) made of GaAs, or a hetero-junction bipolar transistor (HBT).

The PA 11 includes, for example, a transistor element including a base terminal, a collector terminal, and an emitter terminal, a bias circuit, the input electrode 11a, and the output electrode 11b. The transistor element includes, for example, a collector, an emitter, and a base, is an emitter-grounded bipolar transistor, and amplifies high-frequency current input into the base to output the amplified high-frequency current from the collector. The transistor element may be a field effect transistor (FET) including a drain, a source, and a gate. The bias circuit is connected to the base of the transistor element and has a function to apply bias voltage to the base to optimize an operating point of the transistor element. The radio-frequency signal input through the input electrode 11a flows from the base of the transistor element to the emitter thereof as base current Ib. The base current Ib controls amplification by the transistor element of the collector current Ic and the radio-frequency signal corresponding to the collector current Ic is output through the output electrode 11b. At this time, high current resulting from combination of the base current Ib with the collector current Ic flows from the emitter terminal to ground.

The transmission filter 12 is arranged on a transmission path connecting the PA 11 to the common terminal 100 and transmits the radio-frequency transmission signal in a transmission band of the first communication band, among the radio-frequency transmission signals amplified by the PA 11. The reception filter 22 is arranged on a reception path connecting the LNA 21 to the common terminal 100 and transmits the radio-frequency reception signal in a reception band in the first communication band, among the radio-frequency reception signals supplied from the common terminal 100. In the first embodiment, the transmission filter 12 and the reception filter 22 compose a duplexer capable of concurrently transmitting and receiving the radio-frequency signal in the first communication band. Circuit elements, such as switches, may be arranged between the transmission filter 12 and the common terminal 100 and between the reception filter 22 and the common terminal 100. In this case, the radio-frequency transmission signal and the radio-frequency reception signal are processed in time division.

Each of the transmission filter 12 and the reception filter 22 may be, for example, a surface acoustic wave filter, an acoustic wave filter using bulk acoustic waves (BAWs), an LC resonant filter, or a dielectric filter and is not limited to these filters.

The transmission filter 12, the reception filter 22, the LNA 21, and the reception output terminal 120 are not components essential for the radio-frequency modules according to the embodiments of the present disclosure. In this case, the radio-frequency module 1 is a system that transmits the radio-frequency signal in the first communication band.

The radio-frequency module 1 according to the first embodiment may be a circuit that transmits not only the radio-frequency signal in the first communication band but also the radio-frequency signals in multiple communication bands. In this case, the radio-frequency module 1 is a circuit that additionally includes transmission power amplifiers and reception low noise amplifiers that amplify the radio-frequency signals in the communication bands other than the first communication band, transmission filters and reception filters using the communication bands other than the first communication band as pass bands, and switches for switching between the multiple transmission power amplifier, the multiple reception low noise amplifiers, the multiple transmission filters, and the multiple reception filters.

Configurations for improving heat dissipation performance of the radio-frequency module 1 according to the first embodiment are described below.

[1.2 Arrangement Configuration of Circuit Elements in Radio-Frequency Module 1A According to First Example]

Figure 2A:
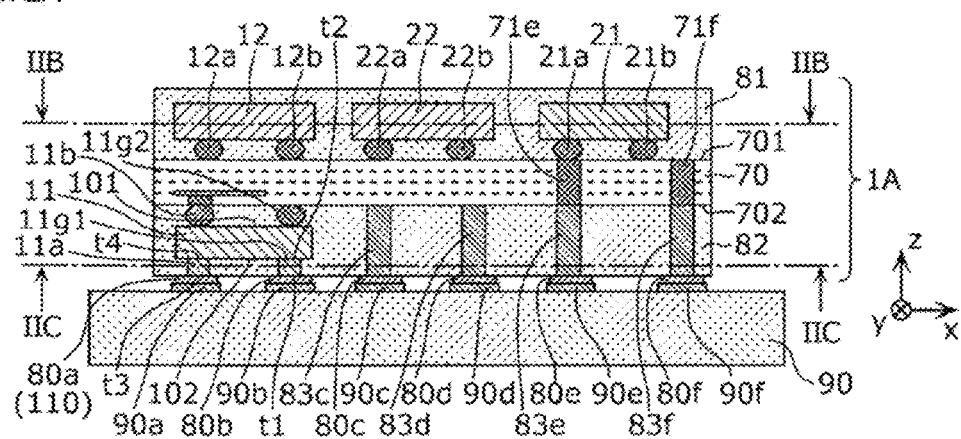
FIG. 2A is a diagram schematically illustrating the configuration of a cross section of a radio-frequency module according to a first example.
Figure 2B:
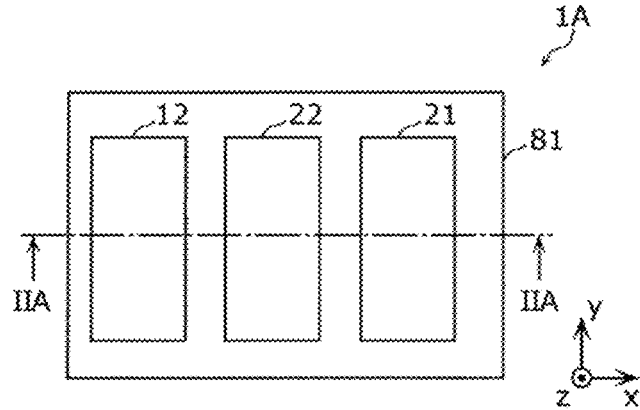
FIG. 2B is a diagram schematically illustrating a first planar configuration of the radio-frequency module according to the first example.
Figure 2C:
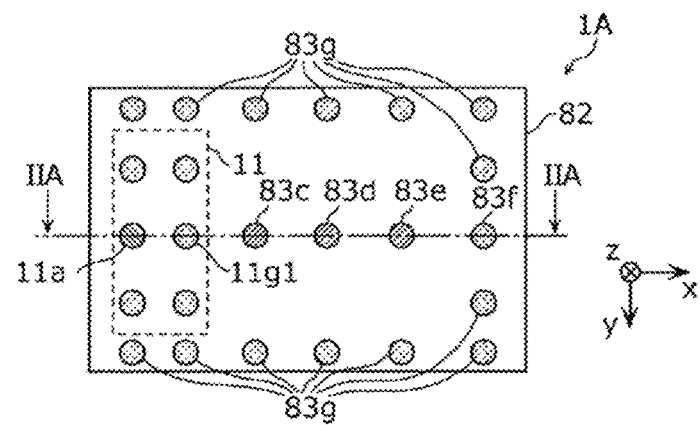
FIG. 2C is a diagram schematically illustrating a second planar configuration of the radio-frequency module according to the first example.

FIG. 2A is a diagram schematically illustrating the configuration of a cross section of a radio-frequency module 1A according to a first example. FIG. 2B is a diagram schematically illustrating a first planar configuration of the radio-frequency module 1A according to the first example. FIG. 2C is a diagram schematically illustrating a second planar configuration of the radio-frequency module 1A according to the first example. Specifically, FIG. 2A is a cross-sectional view taken along the IIA-IIA line in FIG. 2B and FIG. 2C. FIG. 2B is a cross-sectional view taken along the IIB-IIB line in FIG. 2A. FIG. 2C is a cross-sectional view taken along the IIC-IIC line in FIG. 2A.

The radio-frequency module 1A according to the first example illustrated in FIG. 2A to FIG. 2C is an exemplary structure in which the circuit configuration of the radio-frequency module 1 according to the first embodiment is realized as one module.

As illustrated in FIG. 2A, the radio-frequency module 1A according to the first example further includes a module substrate 70 and resin members 81 and 82, in addition to the circuit configuration of the radio-frequency module 1 illustrated in FIG. 1.

The radio-frequency module 1A according to the first example is connected to an external substrate 90, as illustrated in FIG. 2A. The external substrate 90 is arranged at a main surface 702 side (the z-axis negative direction side), among main surfaces 701 and 702, with respect to the radio-frequency module 1A so as to be opposed to the module substrate 70. The external substrate 90 has outer electrodes 90a, 90b, 90c, 90d, 90e, and 90f on the surface in the z-axis positive direction and corresponds to, for example, a mother board of a mobile phone, a communication device, or the like.

The module substrate 70 is a mounting substrate that has a main surface 701 (second main surface) and a main surface 702 (first main surface), which are opposed to each other, and that is capable of mounting circuit components on the main surfaces 701 and 702. For example, a low temperature co-fired ceramic (LTCC) substrate having a laminated structure composed of multiple dielectric layers, a printed circuit board, or the like is used as the module substrate 70.

The resin member 81 is arranged on the main surface 701 of the module substrate 70, covers the transmission filter 12, the reception filter 22, the LNA 21, and the main surface 701, and has a function to ensure the reliability of the mechanical strength, the moisture resistance, and so on of these circuit components. The resin member 82 is arranged on the main surface 702 of the module substrate 70, covers the PA 11 and the main surface 702, and has a function to ensure the reliability of the mechanical strength, the moisture resistance, and so on of the PA 11. It is sufficient for the resin member 82 to cover at least part of the PA 11. The resin members 81 and 82 are not components essential for the radio-frequency modules according to the embodiments of the present disclosure.

As illustrated in FIG. 2A to FIG. 2C, in the radio-frequency module 1A according to the first example, the transmission filter 12, the reception filter 22, and the LNA 21 are surface-mounted on the main surface 701 of the module substrate 70. In contrast, the PA 11 is arranged between the module substrate 70 and the external substrate 90 and is surface-mounted on the main surface 702 (i.e., opposite surface than the main surface 701) of the module substrate 70.

The radio-frequency module 1A further includes external connection electrodes 80a, 80b, 80c, 80d, 80e, and 80f formed on the outer surface (in the z-axis negative direction) of the resin member 82.

The external connection electrode 80c is connected to the module substrate 70 with a columnar electrode (external connection terminal) 83c interposed therebetween. The external connection electrode 80d is connected to the module substrate 70 with a columnar electrode (external connection terminal) 83d interposed therebetween. The external connection electrode 80e is connected to the module substrate 70 with a columnar electrode (external connection terminal) 83e interposed therebetween. The external connection electrode 80f is connected to the module substrate 70 with a columnar electrode (external connection terminal) 83f interposed therebetween.

As illustrated in FIG. 2C, in a plan view of the module substrate 70, multiple columnar electrodes (external connection terminals) 83g with which the main surface 702 is connected to the outer surface of the resin member 82 are arranged in an outer edge area of the radio-frequency module 1A.

Each of the columnar electrodes 83c to 83g and the external connection electrodes 80c to 80f may be a so-called hot terminal through which the radio-frequency signal or a direct-current signal, such as power supply voltage or bias voltage, is transmitted or may be a ground terminal set to ground potential.

The transmission filter 12 has an input electrode 12a and an output electrode 12b connected to the module substrate 70. The reception filter 22 has an input electrode 22a and an output electrode 22b connected to the module substrate 70. The LNA 21 has an input electrode 21a and an output electrode 21b connected to the module substrate 70. The input electrode 21a is connected to the columnar electrode 83e via, for example, a via conductor 71e formed in the module substrate 70. A via conductor 71f formed in the module substrate 70 is connected to, for example, the columnar electrode 83f. The output electrode 22b of the reception filter 22 is connected to the input electrode 21a of the LNA 21 via a line provided in the module substrate 70. Since the reception filter 22 is connected upstream of the LNA 21, it is possible to improve the noise performance of the radio-frequency reception signal amplified by the LNA 21. Since the line with which the reception filter 22 is connected to the LNA 21 is capable of being formed in the module substrate 70, it is possible to shorten the line to reduce the transmission loss of the radio-frequency reception signal.

The external connection electrodes 80a, 80b, 80c, 80d, 80e, and 80f are connected to the outer electrodes 90a, 90b, 90c, 90d, 90e, and 90f, respectively, of the external substrate 90.

The transmission filter 12, the reception filter 22, the LNA 21, the external connection electrodes 80a to 80g, the columnar electrodes 83c to 83f, and the via conductors 71e and 71f are not components essential for the radio-frequency modules according to the embodiments of the present disclosure. The respective external connection electrodes 80a to 80f may be bump members (including solder balls) joined to the apical surfaces in the z-axis negative direction of the input electrode 11a, a ground electrode 11g1, and the columnar electrodes 83c to 83f or may be plated layers or the likes formed at the apical surfaces. When the electrode layers and the electrode terminals are not formed at the apical surfaces as the radio-frequency module 1A, the respective external connection electrodes 80a to 80f, as shown in FIG. 2A, are defined as the apical surfaces themselves.

The PA 11 is the first transmission power amplifier that has a main surface 101 (one main surface) and a main surface 102 (the other main surface), which are opposed to each other, that is arranged between the module substrate 70 and the external substrate 90, and that is mounted on the main surface 702. The PA 11 has the input electrode 11a, the output electrode 11b, the ground electrode 11g1, and a ground electrode 11g2.

The input electrode 11a is a second input-output electrode which is connected to the main surface 102 and the external connection electrode 80a and through which the radio-frequency signal supplied to the PA 11 is transmitted to the inside of the PA 11. More specifically, the input electrode 11a has a connection end t3 (third connection end) and a connection end t4 (fourth connection end) that are arranged in a direction vertical to the main surface 102 so as to be opposed to each other. The connection end t4 is connected to the main surface 102 and the connection end t3 is connected to the external connection electrode 80a to transmit the radio-frequency signal supplied from the external connection electrode 80a to the PA 11. In other words, in the input electrode 11a, the direction connecting the connection end t4 joined to the main surface 102 to the connection end t3 joined to the external connection electrode 80a is vertical to the main surface 102.

The external connection electrode 80a is, for example, the transmission input terminal 110 (the hot terminal), which transmits the radio-frequency signal supplied from the RFIC 6 illustrated in FIG. 1.

The output electrode 11b is a first input-output electrode which is connected to the main surface 101 and the main surface 702 and through which the radio-frequency signal output from the PA 11 is transmitted to the module substrate 70. The output electrode 11b is connected to the input electrode 12a of the transmission filter 12 via a line provided in the module substrate 70. Since the transmission filter 12 is connected downstream of the PA 11, it is possible to improve the noise performance of the radio-frequency transmission signal amplified by the PA 11. Since the line with which the transmission filter 12 is connected to the PA 11 is formed in the module substrate 70, it is possible to shorten the line to reduce the transmission loss of the radio-frequency transmission signal.

The ground electrode 11g1 is a first ground electrode having a connection end t1 (first connection end) and a connection end t2 (second connection end) that are arranged in the direction vertical to the main surface 102 so as to be opposed to each other. The connection end t2 is connected to the main surface 102 and the connection end t1 is connected to the external substrate 90 to set the ground potential of the external substrate 90 for the PA 11. The external connection electrode 80b is a first ground terminal that is arranged on the resin member 82 and that is connected to the ground electrode 11g1. More specifically, in the ground electrode 11g1, the connection end t2 is connected to the main surface 102, the connection end t1 is arranged in the direction vertical to the main surface 102 with respect to the connection end t2, and the connection end t1 is connected to the external connection electrode 80b to transmit the ground potential of the external substrate 90 to the PA 11. In other words, in the ground electrode 11g1, the direction connecting the connection end t2 joined to the main surface 102 to the connection end t1 joined to the external connection electrode 80b is vertical to the main surface 102.

When the PA 11 includes, for example, an emitter-grounded bipolar transistor including a base terminal, a collector terminal, and an emitter terminal, the ground electrode 11g1 is the emitter terminal of the PA 11.

The ground electrode 11g2 is a ground electrode that is connected to the main surface 101 and the main surface 702 and that sets the ground potential of the module substrate 70 for the PA 11. The ground electrode 11g2 is the first input-output electrode through which the radio-frequency signal output from the PA 11 is transmitted to the module substrate 70.

Each of the input electrode 11a and the ground electrode high may be, for example, a columnar electrode having a substantially cylindrical shape, a substantially prismatic shape, or the like, a bump member (including a solder ball), or a metal electrode connected to the electrode of the module substrate 70 with solder.

Each of the output electrode 11b and the ground electrode 11g2 is, for example, a bump member (including a solder ball) or a metal electrode connected to the electrode of the module substrate 70 with solder.

The radio-frequency module 1A according to the first example includes the module substrate 70 having the main surfaces 701 and 702, which are opposed to each other, the columnar electrodes (external connection terminals) 83c to 83f arranged on the main surface 702, and the PA 11 arranged on the main surface 702. The PA 11 includes the main surface 101 closest to the main surface 702, the main surface 102 opposed to the main surface 101, the output electrode 11b, which is arranged on the main surface 101 and which transmits the radio-frequency signal output from the PA 11, and the ground electrode 11g1 connected to the main surface 102.

With the above configuration, since the circuit components are capable of being mounted on both of the mounting faces (the main surfaces 701 and 702) of the module substrate 70, it is possible to increase the density and reduce the size, compared with a radio-frequency module using a single-sided mounting substrate. In addition, the PA 11 having a larger amount of heat generation is mounted on the main surface 702 on which the external connection terminals are arranged, among the main surfaces 701 and 702. In this configuration, the ground electrode 11g1 and the external connection electrode 80b, which are heat radiation paths of the PA 11, are capable of being directly connected to (the outer electrode 90b) of the external substrate 90 not via a plane wiring pattern that is arranged in the module substrate 70 and that is parallel to the main surface 702. Accordingly, even in the configuration in which the PA 11 is mounted on the main surface 702 closer to the external substrate 90, the heat radiation path through the plane wiring pattern having high thermal resistance, among the lines in the module substrate 70, is capable of being excluded. Consequently, it is possible to provide the compact radio-frequency module 1A having improved heat dissipation from the PA 11 to the external substrate 90.

In addition, in the first example, the input electrode 11a of the PA 11 is connected to the main surface 102 and the output electrode 11b thereof is connected to the main surface 101. In other words, the input electrode 11a and the output electrode 11b of the PA 11 are distributed to the main surfaces 101 and 102, which are opposed to each other. Accordingly, since the signal path between the input side and the output side of the PA 11 is capable of being shortened, it is possible to reduce the transmission loss of the radio-frequency signal.

As illustrated in FIG. 2A, the PA 11 and the transmission filter 12 may be at least partially overlapped with each other in a plan view of the module substrate 70. In this case, since the line in the module substrate 70, with which the transmission filter 12 is connected to the PA 11, is capable of being shortened, it is possible to further reduce the transmission loss of the radio-frequency transmission signal.

As illustrated in FIG. 2A, the PA 11 and the LNA 21 do not overlap in a plan view of the module substrate 70 so heat from the PA 11 is less likely to be transmitted to the LNA 21 to suppress characteristic fluctuation caused by the heat of the LNA 21.

[1.3 Arrangement Configuration of Circuit Elements in Radio-Frequency Module 1B According to a First Modification]

Figure 3:
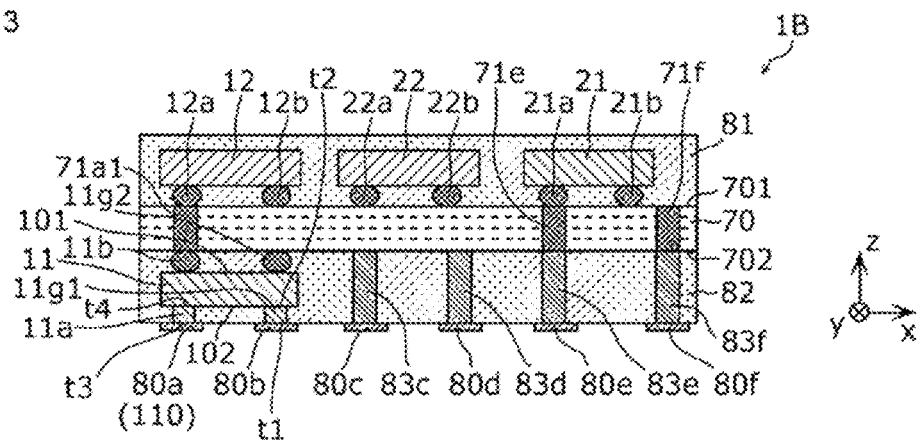
FIG. 3 is a diagram schematically illustrating the configuration of a cross section of a radio-frequency module according to a first modification of the first embodiment.

FIG. 3 is a diagram schematically illustrating the configuration of a cross section of a radio-frequency module 1B according to a first modification of the first embodiment. The radio-frequency module 1B according to the first modification differs from the radio-frequency module 1A according to the first example only in the configuration of connection between the PA 11 and the transmission filter 12. A description of the same points of the radio-frequency module 1B according to the first modification as in the radio-frequency module 1A according to the first example is omitted, and the radio-frequency module 1B according to the first modification is described with a focus on points different from the radio-frequency module 1A according to the first example.

The output electrode 11b of the PA 11 is connected to the input electrode 12a of the transmission filter 12 via a via conductor 71a1 passing through the module substrate 70 in the direction vertical to the main surfaces 701 and 702 (the z-axis direction).

With the above configuration, since the transmission filter 12 and the PA 11 are connected to the low-resistance via conductor 71a1, it is possible to further reduce the transmission loss of the radio-frequency transmission signal.

[1.4 Arrangement Configuration of Circuit Elements in Radio-Frequency Module 1C According to a Second Modification]

Figure 4:
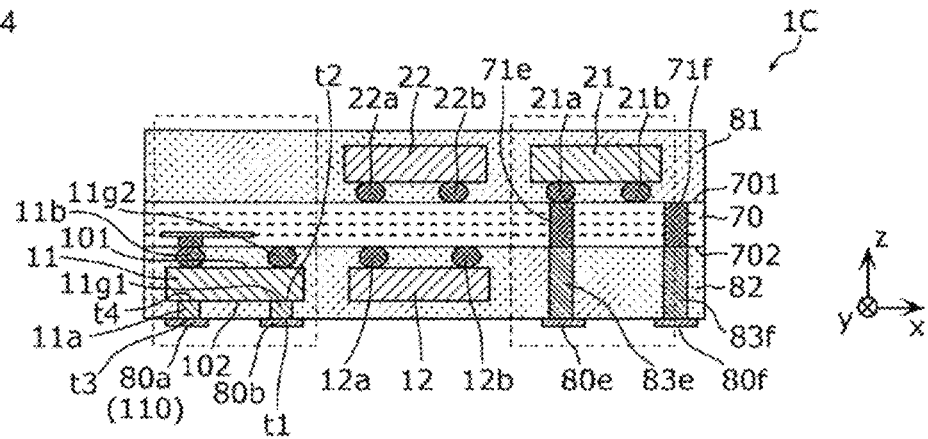
FIG. 4 is a diagram schematically illustrating the configuration of a cross section of a radio-frequency module according to a second modification of the first embodiment.

FIG. 4 is a diagram schematically illustrating the configuration of a cross section of a radio-frequency module 1C according to a second modification of the first embodiment. The radio-frequency module 1C according to the second modification differs from the radio-frequency module 1A according to the first example only in the arrangement configuration of the transmission filter 12. A description of the same points of the radio-frequency module 1C according to the second modification as in the radio-frequency module 1A according to the first example is omitted, and the radio-frequency module 1C according to the second modification is described with a focus on points different from the radio-frequency module 1A according to the first example.

As illustrated in FIG. 4, the reception filter 22 and the LNA 21 are surface-mounted on the main surface 701 of the module substrate 70. In contrast, the PA 11 and the transmission filter 12 are surface-mounted on the main surface 702 of the module substrate 70.

The transmission filter 12 has the input electrode 12a and the output electrode 12b, which are connected to the main surface 702 of the module substrate 70.

With the above configuration, since the transmission filter 12 and the PA 11 are capable of being arranged on the same main surface 702, it is possible to reduce the transmission loss of the radio-frequency transmission signal.

[1.5 Arrangement Configuration of Circuit Elements in Radio-Frequency Module 1D According to a Third Modification]

Figure 5:
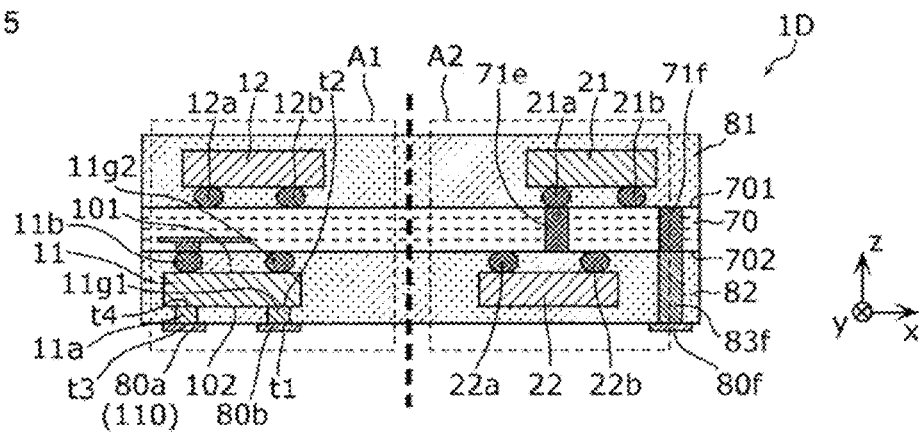
FIG. 5 is a diagram schematically illustrating the configuration of a cross section of a radio-frequency module according to a third modification of the first embodiment.

FIG. 5 is a diagram schematically illustrating the configuration of a cross section of a radio-frequency module 1D according to a third modification of the first embodiment. The radio-frequency module 1D according to the third modification differs from the radio-frequency module 1A according to the first example in the arrangement configuration of the reception filter 22. A description of the same points of the radio-frequency module 1D according to the third modification as in the radio-frequency module 1A according to the first example is omitted, and the radio-frequency module 1D according to the third modification is described with a focus on points different from the radio-frequency module 1A according to the first example.

As illustrated in FIG. 5, the transmission filter 12 and the LNA 21 are surface-mounted on the main surface 701 of the module substrate 70. In contrast, the PA 11 and the reception filter 22 are surface-mounted on the main surface 702 of the module substrate 70.

The reception filter 22 has the input electrode 22a and the output electrode 22b, which are connected to the main surface 702 of the module substrate 70.

In a plan view of the module substrate 70 (in a cross-sectional view of the module substrate 70 in FIG. 5), the PA 11 and the transmission filter 12 are arranged in an area A1 (first area) and the LNA 21 and the reception filter 22 are arranged in an area A2 (second area) that is not overlapped with the area A1.

With the above configuration, since the transmission path and the reception path are separately arranged in the area A1 and the area A2, isolation between the transmission side and the reception side is improved.

[1.6 Arrangement Configuration of Circuit Elements in Radio-Frequency Module 1E According to a Fourth Modification]

Figure 6:
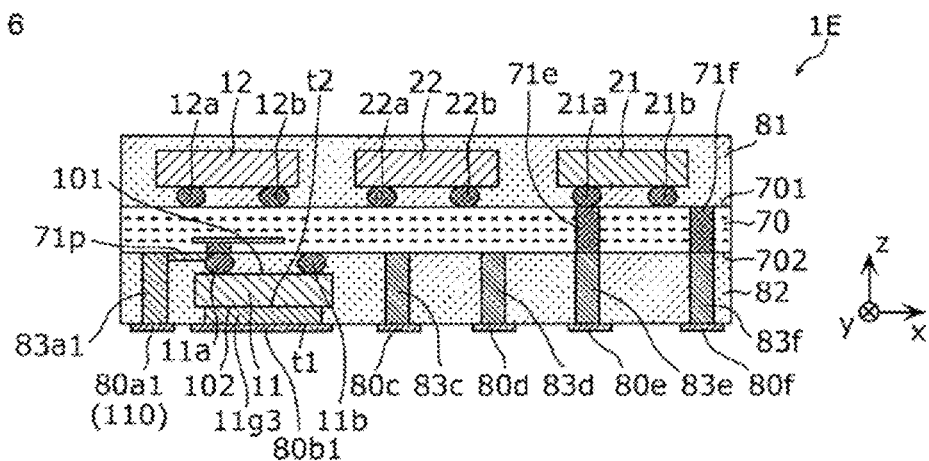
FIG. 6 is a diagram schematically illustrating the configuration of a cross section of a radio-frequency module according to a fourth modification of the first embodiment.

FIG. 6 is a diagram schematically illustrating the configuration of a cross section of a radio-frequency module 1E according to a fourth modification of the first embodiment. The radio-frequency module 1E according to the fourth modification differs from the radio-frequency module 1A according to the first example in the configuration of the input-output electrodes of the PA 11 and the connection configuration of the transmission input terminal 110. A description of the same points of the radio-frequency module 1E according to the fourth modification as in the radio-frequency module 1A according to the first example is omitted, and the radio-frequency module 1E according to the fourth modification is described with a focus on points different from the radio-frequency module 1A according to the first example.

As illustrated in FIG. 6, in the radio-frequency module 1E according to the fourth modification, the transmission filter 12, the reception filter 22, and the LNA 21 are surface-mounted on the main surface 701 of the module substrate 70. In contrast, the PA 11 is surface-mounted on the main surface 702 of the module substrate 70.

The radio-frequency module 1E further includes external connection electrodes 80a1, 80b1, 80c, 80d, 80e, and 80f formed on the outer surface (in the z-axis negative direction) of the resin member 82, a connection electrode (external connection terminal) 83a1, and a plane wiring pattern 71p.

The external connection electrode 80a1 is, for example, the transmission input terminal 110 (the hot terminal) through which the radio-frequency signal supplied from the RFIC 6 illustrated in FIG. 1 is transmitted.

The connection electrode 83a1 is a columnar electrode formed in the resin member 82 so as to extend in the direction vertical to the main surface 702. The external connection electrode 80a1 is connected to the main surface 702 with the connection electrode 83a1 interposed therebetween.

The plane wiring pattern 71p is formed on the main surface 702 along a direction parallel to the main surface 702. The connection electrode 83a1 is connected to the input electrode 11a via the plane wiring pattern 71p.

The PA 11 is the first transmission power amplifier that has the main surface 101 (one main surface) and the main surface 102 (the other main surface), which are opposed to each other, and that is mounted on the main surface 702 so that the main surface 101 is opposed to the main surface 702. The PA 11 further includes the input electrode 11a, the output electrode 11b, and a ground electrode 11g3.

The input electrode 11a is the second input-output electrode which is connected to the main surface 101 and the main surface 702 and through which the radio-frequency signal through the external connection electrode 80a1 and the connection electrode 83a1 is transmitted to the PA 11.

The output electrode 11b is the first input-output electrode which is connected to the main surface 101 and the main surface 702 and through which the radio-frequency signal output from the PA 11 is transmitted to the module substrate 70.

Each of the input electrode 11a and the output electrode 11b is, for example, a bump member (including a solder ball) or a metal electrode connected to the electrode of the module substrate 70 with solder.

The ground electrode 11g3 is the first ground electrode that is connected to the main surface 102 and the external connection electrode 80b1 and that sets the ground potential of the external substrate 90 for the PA 11. The external connection electrode 80b1 is the first ground terminal that is arranged on the resin member 82 and that is connected to the ground electrode 11g3. More specifically, the ground electrode 11g3 has the connection end t1 (first connection end) and the connection end t2 (second connection end) that are arranged in the direction vertical to the main surface 102 so as to be opposed to each other. The connection end t2 is connected to the main surface 102 and the connection end t1 is connected to the external substrate 90 to transmit the ground potential of the external substrate 90 to the PA 11. In other words, in the ground electrode 11g3, the direction connecting the connection end t2 joined to the main surface 102 to the connection end t1 joined to the external connection electrode 80b1 is vertical to the main surface 102.

The ground electrode 11g3 may be, for example, a columnar electrode having a substantially cylindrical shape, a substantially prismatic shape, or the like, a bump member (including a solder ball), or a metal electrode connected to the electrode of the module substrate 70 with solder.

In the first example, the input electrode 11a and the output electrode 11b of the PA 11 are distributed to the main surfaces 101 and 102, which are opposed to each other, and the ground electrode 11g1 is arranged on the main surface 102. In contrast, in the fourth modification, both the input electrode 11a and the output electrode 11b of the PA 11 are arranged on the main surface 101 and the ground electrode 11g3 is arranged on the main surface 102.

With the above configuration, even in the configuration in which the PA 11 is mounted on the main surface 702 closer to the external substrate 90, the heat is capable of being radiated from the PA 11 to the external substrate 90 through the ground electrode 11g3 not via the plane wiring pattern having high thermal resistance, among the lines in the module substrate 70. In addition, since both the input electrode 11a and the output electrode 11b of the PA 11 are arranged on the main surface 101, the ground electrode 11g3 arranged on the main surface 102 is capable of being arranged without being restricted by the input electrode 11a and the output electrode 11b. Accordingly, it is possible to further improve the heat dissipation from the PA 11.

As illustrated in FIG. 6, in a plan view of the main surfaces 101 and 102, the area of the ground electrode 11g3 may be greater than the area of the input electrode 11a and the area of the output electrode 11b. In this case, it is possible to further improve the heat dissipation from the PA 11.

In the connection of the radio-frequency module 1E to the external substrate 90, the exposed surface of the external connection electrode 80b1 or the ground electrode 11g3 may be matched with the electrode pattern (for example, a substantially circular shape) of the outer electrode formed on the external substrate 90. For example, resist may be formed on the surface of the external connection electrode 80b1 so that the exposed surface of the external connection electrode 80b1 or the ground electrode 11g3 are multiple substantially circular shapes. Alternatively, irregularities may be provided on the exposed surface of the ground electrode 11g3 to be matched with the electrode pattern (for example, a substantially circular shape) of the outer electrode.

[1.7 Arrangement Configuration of Circuit Elements in Radio-Frequency Module 1F According to a Fifth Modification]

Figure 7A:
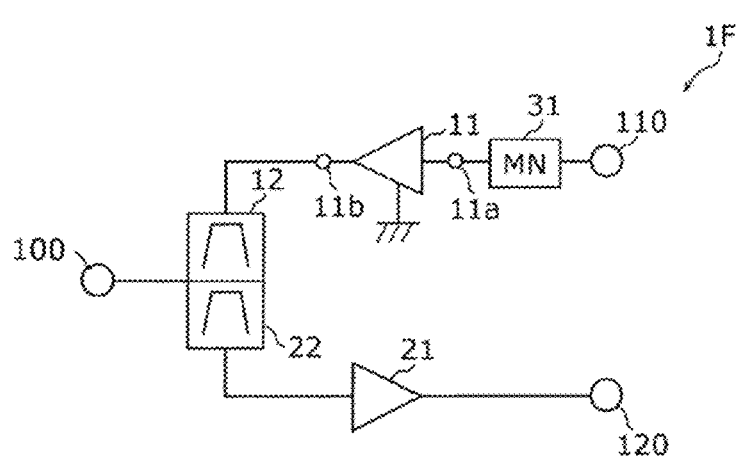
FIG. 7A is a circuit configuration diagram of a radio-frequency module according to a fifth modification of the first embodiment.
Figure 7B:
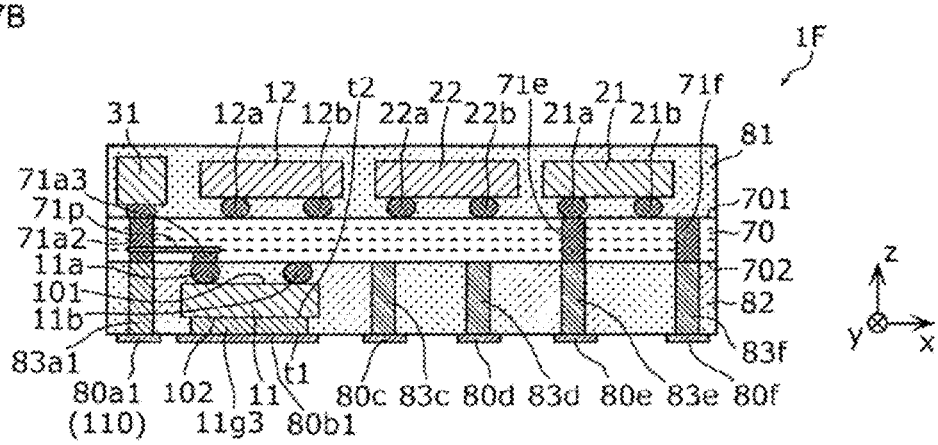
FIG. 7B is a diagram schematically illustrating the configuration of a cross section of the radio-frequency module according to the fifth modification of the first embodiment.

FIG. 7A is a circuit configuration diagram of a radio-frequency module 1F according to a fifth modification of the first embodiment. FIG. 7B is a diagram schematically illustrating the configuration of a cross section of the radio-frequency module 1F according to the fifth modification of the first embodiment. The radio-frequency module 1F according to the fifth modification differs from the radio-frequency module 1E according to the fourth modification in that a matching circuit is arranged on a path with which the transmission input terminal 110 (the external connection electrode 80a1) is connected to the PA 11. A description of the same points of the radio-frequency module 1F according to the fifth modification as in the radio-frequency module 1E according to the fourth modification is omitted, and the radio-frequency module 1F according to the fifth modification is described with a focus on points different from the radio-frequency module 1E according to the fourth modification.

The radio-frequency module 1F further includes a transmission matching circuit 31, in addition to the components in the radio-frequency module 1E according to the fourth modification.

As illustrated in FIG. 7A, the transmission matching circuit 31 is arranged on the path with which the transmission input terminal 110 (the external connection electrode 80a1) is connected to the input electrode 11a of the PA 11 and matches the output impedance of an external circuit connected to the transmission input terminal 110 with the input impedance of the PA 11. The transmission matching circuit 31 is composed of, for example, passive elements, such as an inductor and a capacitor. The transmission matching circuit 31 may be arranged in series between the transmission input terminal 110 and the input electrode 11a or may be arranged between a node on the path with which the transmission input terminal 110 is connected to the input electrode 11a and the ground.

As illustrated in FIG. 7B, for example, the transmission matching circuit 31 is mounted on the main surface 701 and is connected to the connection electrode 83a1 via a via conductor 71a2 formed in the module substrate 70. The via conductor 71a2 is connected to the input electrode 11a via the plane wiring pattern 71p.

With the above configuration, since the transmission matching circuit 31 connected upstream of the PA 11 and the PA 11 are capable of being arranged so as to be opposed to each other with the module substrate 70 interposed therebetween, it is possible to connect the transmission input terminal 110, the transmission matching circuit 31, and the PA 11 with a shortest distance. Accordingly, it is possible to realize the impedance matching with high accuracy in which parasitic capacitance and parasitic inductance are excluded as much as possible.

[1.8 Arrangement Configuration of Circuit Elements in Radio-Frequency Module 1G According to a Sixth Modification]

Figure 8A:
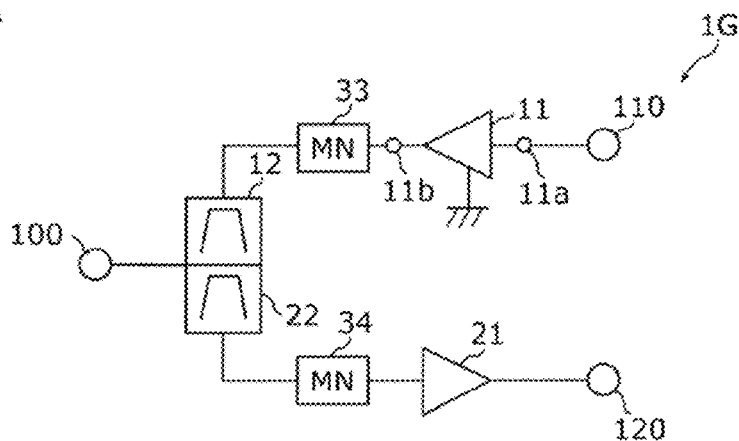
FIG. 8A is a circuit configuration diagram of a radio-frequency module according to a sixth modification of the first embodiment.
Figure 8B:
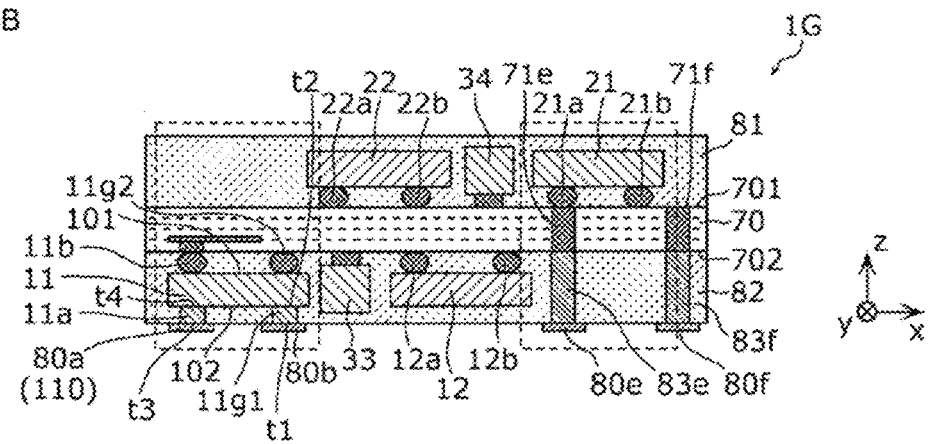
FIG. 8B is a diagram schematically illustrating the configuration of a cross section of the radio-frequency module according to the sixth modification of the first embodiment.

FIG. 8A is a circuit configuration diagram of a radio-frequency module 1G according to a sixth modification of the first embodiment. FIG. 8B is a diagram schematically illustrating the configuration of a cross section of the radio-frequency module 1G according to the sixth modification of the first embodiment. The radio-frequency module 1G according to the sixth modification differs from the radio-frequency module 1A according to the first example in addition of matching circuits and in the arrangement of the transmission filter 12. A description of the same points of the radio-frequency module 1G according to the sixth modification as in the radio-frequency module 1A according to the first example is omitted, and the radio-frequency module 1G according to the sixth modification is described with a focus on points different from the radio-frequency module 1A according to the first example.

The radio-frequency module 1G further includes a transmission matching circuit 33 and a reception matching circuit 34, in addition to the components in the radio-frequency module 1A according to the first example.

As illustrated in FIG. 8A, the transmission matching circuit 33 is arranged on the path with which the output electrode 11b (the first input-output electrode) of the PA 11 is connected to an input end of the transmission filter 12 and matches the output impedance of the PA 11 with the input impedance of the transmission filter 12. The transmission matching circuit 33 is composed of, for example, passive elements, such as an inductor and a capacitor. The transmission matching circuit 33 may be arranged in series between the output electrode 11b and the transmission filter 12 or may be arranged between a node on the path with which the output electrode 11b is connected to the transmission filter 12 and the ground.

As illustrated in FIG. 8A, the reception matching circuit 34 is arranged on the path with which an output end of the reception filter 22 is connected to an input terminal of the LNA 21 and matches the output impedance of the reception filter 22 with the input impedance of the LNA 21. The reception matching circuit 34 is composed of, for example, passive elements, such as an inductor and a capacitor. The reception matching circuit 34 may be arranged in series between the reception filter 22 and the LNA 21 or may be arranged between a node on the path with which the reception filter 22 is connected to the LNA 21 and the ground.

As illustrated in FIG. 8B, the PA 11 and the transmission filter 12 are mounted on the main surface 702 of the module substrate 70. The transmission matching circuit 33 is mounted on the main surface 702 and is arranged between the PA 11 and the transmission filter 12. The LNA 21 and the reception filter 22 are mounted on the main surface 701 of the module substrate 70. The reception matching circuit 34 is mounted on the main surface 701 and is arranged between the LNA 21 and the reception filter 22.

With the above configuration, since the PA 11, the transmission matching circuit 33, and the transmission filter 12 are sequentially arranged in the x-axis positive direction on the main surface 702, the line length of the transmission path is capable of being shortened. In addition, since the reception filter 22, the reception matching circuit 34, and the LNA 21 are sequentially arranged in the x-axis positive direction on the main surface 701, the line length of the reception path is capable of being shortened. Accordingly, it is possible to reduce the transmission loss of the radio-frequency transmission signal and the radio-frequency reception signal in the radio-frequency module 1G.

Also in the sixth modification, the PA 11 is not overlapped with the LNA 21 in a plan view of the module substrate 70, as in the first example. Accordingly, the heat from the PA 11 is less likely to be transmitted to the LNA 21 to suppress the characteristic fluctuation caused by the heat of the LNA 21.

[1.9 Arrangement Configuration of Circuit Elements in Radio-Frequency Module 1H According to a Seventh Modification]

Figure 8C:
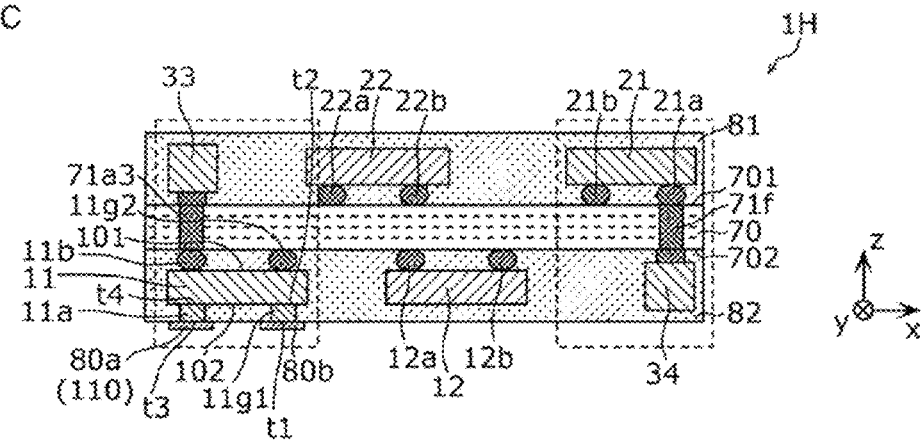
FIG. 8C is a diagram schematically illustrating the configuration of a cross section of a radio-frequency module according to a seventh modification of the first embodiment.

FIG. 8C is a diagram schematically illustrating the configuration of a cross section of a radio-frequency module 1H according to a seventh modification of the first embodiment. The radio-frequency module 1H according to the seventh modification differs from the radio-frequency module 1G according to the sixth modification in the arrangement of the matching circuits. A description of the same points of the radio-frequency module 1H according to the seventh modification as in the radio-frequency module 1G according to the sixth modification is omitted, and the radio-frequency module 1H according to the seventh modification is described with a focus on points different from the radio-frequency module 1G according to the sixth modification.

The circuit configuration of the radio-frequency module 1H is the same as the circuit configuration illustrated in FIG. 8A.

As illustrated in FIG. 8C, the PA 11 and the transmission filter 12 are mounted on the main surface 702 of the module substrate 70. The transmission matching circuit 33 is mounted on the main surface 701. The output electrode 11b of the PA 11 is connected to the transmission matching circuit 33 via, for example, a via conductor 71a3 formed in the module substrate 70. The LNA 21 and the reception filter 22 are mounted on the main surface 701 of the module substrate 70. The reception matching circuit 34 is mounted on the main surface 702. The input electrode 21a of the LNA 21 is connected to the reception matching circuit 34 via, for example, the via conductor 71f formed in the module substrate 70.

In a plan view of the module substrate 70, the transmission filter 12 and the reception filter 22 are arranged between the transmission matching circuit 33 and the reception matching circuit 34.

Accordingly, electromagnetic field coupling between the transmission matching circuit 33 and the reception matching circuit 34 is capable of being suppressed. Consequently, since the inflow of harmonic wave components and intermodulation distortion components of the high-output-power radio-frequency transmission signal amplified by the PA 11 into the reception filter 22 and the LNA 21 (reception circuit) is capable of being reduced, it is possible to suppress degradation of the reception sensitivity of the radio-frequency module 1H.

In a plan view of the module substrate 70, it is sufficient for at least one of the PA 11, the LNA 21, the transmission filter 12, and the reception filter 22 to be arranged between the transmission matching circuit 33 and the reception matching circuit 34.

As the arrangement configuration to suppress the electromagnetic field coupling between the transmission matching circuit 33 and the reception matching circuit 34 to the maximum, it is desirable that the transmission matching circuit 33 be arranged at the x-axis negative direction side with respect to the reception filter 22 and the LNA 21 and the reception matching circuit 34 be arranged at the x-axis positive direction side with respect to the transmission filter 12 and the PA 11.

[1.10 Arrangement Configuration of Circuit Elements in Radio-Frequency Module 1J According to an Eighth Modification]

Figure 8D:
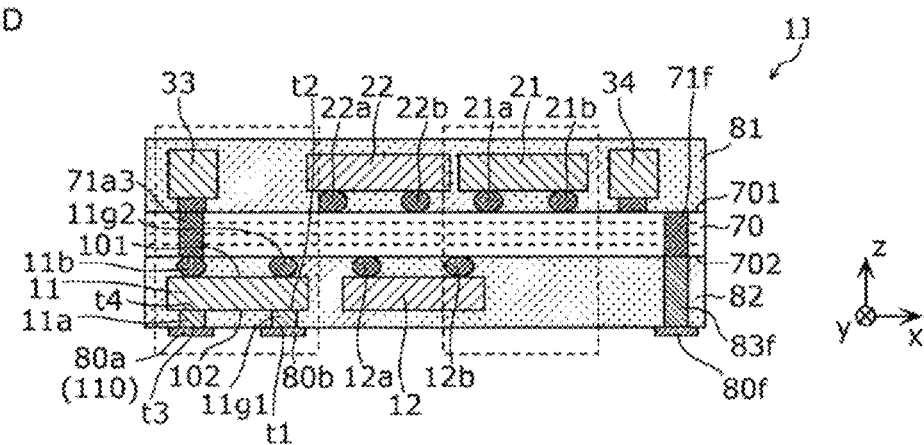
FIG. 8D is a diagram schematically illustrating the configuration of a cross section of a radio-frequency module according to an eighth modification of the first embodiment.

FIG. 8D is a diagram schematically illustrating the configuration of a cross section of a radio-frequency module 1J according to an eighth modification of the first embodiment. The radio-frequency module 1J according to the eighth modification differs from the radio-frequency module 1H according to the seventh modification in the arrangement of the matching circuits. A description of the same points of the radio-frequency module 1J according to the eighth modification as in the radio-frequency module 1H according to the seventh modification is omitted, and the radio-frequency module 1J according to the eighth modification is described with a focus on points different from the radio-frequency module 1H according to the seventh modification.

The circuit configuration of the radio-frequency module 1J is the same as the circuit configuration illustrated in FIG. 8A.

As illustrated in FIG. 8D, the PA 11 and the transmission filter 12 are mounted on the main surface 702 of the module substrate 70. The transmission matching circuit 33 is mounted on the main surface 701. The output electrode 11b of the PA 11 is connected to the transmission matching circuit 33 via, for example, the via conductor 71a3 formed in the module substrate 70. The LNA 21 and the reception filter 22 are formed on the main surface 701 of the module substrate 70. The reception matching circuit 34 is formed on the main surface 701.

In a plan view of the module substrate 70, the transmission filter 12, the reception filter 22, and the LNA 21 are arranged between the transmission matching circuit 33 and the reception matching circuit 34.

Accordingly, the electromagnetic field coupling between the transmission matching circuit 33 and the reception matching circuit 34 is capable of being suppressed. Consequently, since the inflow of the harmonic wave components and the intermodulation distortion components of the high-output-power radio-frequency transmission signal amplified by the PA 11 into the reception filter 22 and the LNA 21 (reception circuit) is capable of being reduced, it is possible to suppress the degradation of the reception sensitivity of the radio-frequency module 1J.

In a plan view of the module substrate 70, it is sufficient for at least one of the PA 11, the LNA 21, the transmission filter 12, and the reception filter 22 to be arranged between the transmission matching circuit 33 and the reception matching circuit 34.

The transmission matching circuit 33 and the reception matching circuit 34 are frequently composed of chip inductors and chip capacitors. In this case, the heights of the transmission matching circuit 33 and the reception matching circuit 34 are greater than the heights of the other components. In contrast, with the above configuration, integrating the transmission matching circuit 33 and the reception matching circuit 34 having greater heights at the main surface 701 side enables the mounting heights of the components at the main surface 702 side to be decreased and the mounting density on the main surface 702 to be reduced.

As the arrangement configuration to suppress the electromagnetic field coupling between the transmission matching circuit 33 and the reception matching circuit 34 to the maximum, it is desirable that the transmission matching circuit 33 be arranged at the x-axis negative direction side with respect to the reception filter 22 and the LNA 21 and the reception matching circuit 34 be arranged at the x-axis positive direction side with respect to the reception filter 22 and the LNA 21.

Also in the eighth modification, the PA 11 is not overlapped with the LNA 21 in a plan view of the module substrate 70, as in the first example. Accordingly, the heat from the PA 11 is less likely to be transmitted to the LNA 21 to suppress the characteristic fluctuation caused by the heat of the LNA 21.

[1.11 Arrangement Configuration of Circuit Elements in Radio-Frequency Module 1K According to a Ninth Modification]

Figure 8E:
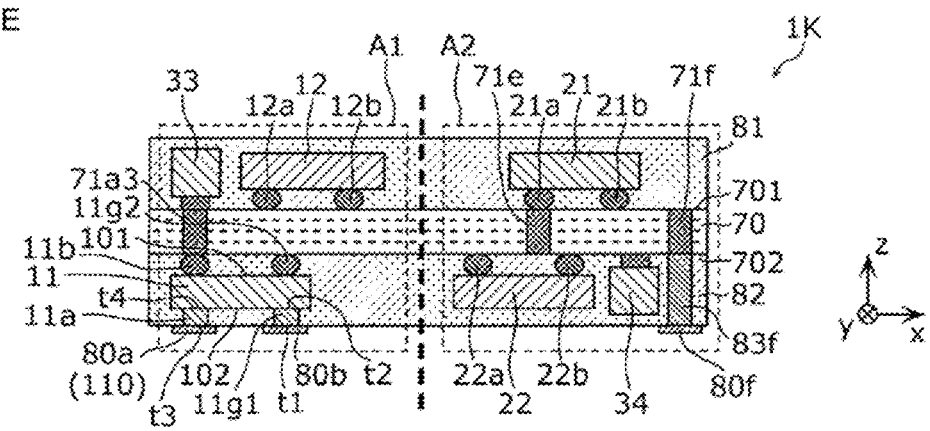
FIG. 8E is a diagram schematically illustrating the configuration of a cross section of a radio-frequency module according to a ninth modification of the first embodiment.

FIG. 8E is a diagram schematically illustrating the configuration of a cross section of a radio-frequency module 1K according to a ninth modification of the first embodiment. The radio-frequency module 1K according to the ninth modification differs from the radio-frequency module 1A according to the first example in addition of the matching circuits and in the arrangement of the reception filter 22. A description of the same points of the radio-frequency module 1K according to the ninth modification as in the radio-frequency module 1A according to the first example is omitted, and the radio-frequency module 1K according to the ninth modification is described with a focus on points different from the radio-frequency module 1A according to the first example.

The circuit configuration of the radio-frequency module 1K is the same as the circuit configuration illustrated in FIG. 8A.

The radio-frequency module 1K further includes the transmission matching circuit 33 and the reception matching circuit 34, in addition to the components in the radio-frequency module 1A according to the first example.

As illustrated in FIG. 8E, the PA 11 is mounted on the main surface 702 of the module substrate 70 and the transmission filter 12 is mounted on the main surface 701 of the module substrate 70. The transmission matching circuit 33 is mounted on the main surface 701. The output electrode 11b of the PA 11 is connected to the transmission matching circuit 33 via, for example, the via conductor 71a3 formed in the module substrate 70. The LNA 21 is mounted on the main surface 701 of the module substrate 70 and the reception filter 22 is mounted on the main surface 702 of the module substrate 70. The reception matching circuit 34 is mounted on the main surface 702.

In a plan view of the module substrate 70, the transmission filter 12 and the reception filter 22 are arranged between the transmission matching circuit 33 and the reception matching circuit 34.

Accordingly, the electromagnetic field coupling between the transmission matching circuit 33 and the reception matching circuit 34 is capable of being suppressed. Consequently, since the inflow of the harmonic wave components and the intermodulation distortion components of the high-output-power radio-frequency transmission signal amplified by the PA 11 into the reception filter 22 and the LNA 21 (reception circuit) is capable of being reduced, it is possible to suppress the degradation of the reception sensitivity of the radio-frequency module 1K.

In a plan view of the module substrate 70, it is sufficient for at least one of the PA 11, the LNA 21, the transmission filter 12, and the reception filter 22 to be arranged between the transmission matching circuit 33 and the reception matching circuit 34.

As the arrangement configuration to suppress the electromagnetic field coupling between the transmission matching circuit 33 and the reception matching circuit 34 to the maximum, it is desirable that the transmission matching circuit 33 be arranged at the x-axis negative direction side with respect to the transmission filter 12 and the LNA 21 and the reception matching circuit 34 be arranged at the x-axis positive direction side with respect to the reception filter 22 and the PA 11.

In a plan view of the module substrate 70 (in a cross-sectional view of the module substrate 70 in FIG. 8E), the PA 11 and the transmission filter 12 are arranged in the area A1 (first area) and the LNA 21 and the reception filter 22 are arranged in the area A2 (second area) that is not overlapped with the area A1.

With the above configuration, since the transmission path and the reception path are separately arranged in the area A1 and the area A2, the isolation between the transmission side and the reception side is improved.

[1.12 Arrangement Configuration of Circuit Elements in Radio-Frequency Module 1L According to a Tenth Modification]

Figure 8F:
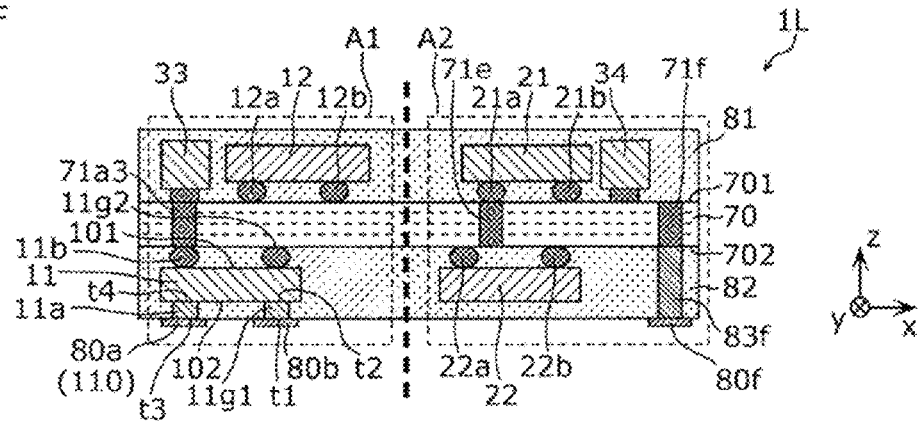
FIG. 8F is a diagram schematically illustrating the configuration of a cross section of a radio-frequency module according to a tenth modification of the first embodiment.

FIG. 8F is a diagram schematically illustrating the configuration of a cross section of a radio-frequency module 1L according to a tenth modification of the first embodiment. The radio-frequency module 1L according to the tenth modification differs from the radio-frequency module 1K according to the ninth modification in the arrangement of the matching circuits. A description of the same points of the radio-frequency module 1L according to the tenth modification as in the radio-frequency module 1K according to the ninth modification is omitted, and the radio-frequency module 1L according to the tenth modification is described with a focus on points different from the radio-frequency module 1K according to the ninth modification.

The circuit configuration of the radio-frequency module 1L is the same as the circuit configuration illustrated in FIG. 8A.

As illustrated in FIG. 8F, the PA 11 is mounted on the main surface 702 of the module substrate 70 and the transmission filter 12 is mounted on the main surface 701 of the module substrate 70. The transmission matching circuit 33 is mounted on the main surface 701. The output electrode 11b of the PA 11 is connected to the transmission matching circuit 33 via, for example, the via conductor 71a3 formed in the module substrate 70. The LNA 21 is mounted on the main surface 701 of the module substrate 70 and the reception filter 22 is mounted on the main surface 702 of the module substrate 70. The reception matching circuit 34 is mounted on the main surface 701.

In a plan view of the module substrate 70, the transmission filter 12 and the LNA 21 are arranged between the transmission matching circuit 33 and the reception matching circuit 34.

Accordingly, the electromagnetic field coupling between the transmission matching circuit 33 and the reception matching circuit 34 is capable of being suppressed. Consequently, since the inflow of the harmonic wave components and the intermodulation distortion components of the high-output-power radio-frequency transmission signal amplified by the PA 11 into the reception filter 22 and the LNA 21 (reception circuit) is capable of being reduced, it is possible to suppress the degradation of the reception sensitivity of the radio-frequency module 1L.

In a plan view of the module substrate 70, it is sufficient for at least one of the PA 11, the LNA 21, the transmission filter 12, and the reception filter 22 to be arranged between the transmission matching circuit 33 and the reception matching circuit 34.

The transmission matching circuit 33 and the reception matching circuit 34 are frequently composed of chip inductors and chip capacitors. In this case, the heights of the transmission matching circuit 33 and the reception matching circuit 34 are greater than the heights of the other components. With the above configuration, integrating the transmission matching circuit 33 and the reception matching circuit 34 having greater heights at the main surface 701 side enables the mounting heights of the components at the main surface 702 side to be decreased and the mounting density on the main surface 702 to be reduced. Accordingly, it is possible to improve the heat dissipation of the PA 11 mounted on the main surface 702.

As the arrangement configuration to suppress the electromagnetic field coupling between the transmission matching circuit 33 and the reception matching circuit 34 to the maximum, it is desirable that the transmission matching circuit 33 be arranged at the x-axis negative direction side with respect to the transmission filter 12 and the LNA 21 and the reception matching circuit 34 be arranged at the x-axis positive direction side with respect to the transmission filter 12 and the LNA 21.

In a plan view of the module substrate 70 (in a cross-sectional view of the module substrate 70 in FIG. 8F), the PA 11 and the transmission filter 12 are arranged in the area A1 (first area) and the LNA 21 and the reception filter 22 are arranged in the area A2 (second area) that is not overlapped with the area A1.

With the above configuration, since the transmission path and the reception path are separately arranged in the area A1 and the area A2, the isolation between the transmission side and the reception side is improved.

[1.13 Transmission Power Amplifier According to the First Embodiment]

As described in the example and the modifications described above, in the transmission power amplifier mounted on the mounting substrate, such as the module substrate 70, it is important to suppress increase of the temperature of the transmission power amplifier by improving the heat dissipation to suppress degradation of amplification performance.

The reduction of the transmission loss of the radio-frequency signal is exemplified as the measures to improve the amplification performance of the transmission power amplifier, as in the improvement of the heat dissipation.

However, forming the path connecting the input terminal of the transmission power amplifier to the output terminal thereof in the direction parallel to the mounting face of the mounting substrate may increase the length of the path to increase the transmission loss.

In contrast, realizing the electrode configuration of, for example, the input electrode 12a and the output electrode 12b as in the PA 11 according to the first example enables the transmission loss of the radio-frequency signal to be reduced.

The transmission power amplifier according to the embodiment of the present disclosure is the transmission power amplifier mounted on the mounting substrate having the first main surface and the second main surface, which are opposed to each other and on which the circuit components are capable of being mounted. The transmission power amplifier has one main surface and the other main surface, which are opposed to each other. The transmission power amplifier further includes the first input-output electrode and the second input-output electrode. The first input-output electrode is connected to the one main surface, and one of the radio-frequency signal input into the transmission power amplifier and the radio-frequency signal output from the transmission power amplifier is transmitted through the first input-output electrode. The second input-output electrode is connected to the other main surface, and the other of the radio-frequency signal input into the transmission power amplifier and the radio-frequency signal output from the transmission power amplifier is transmitted through the second input-output electrode.

With the above configuration, the first input-output electrode and the second input-output electrode of the transmission power amplifier are distributed to the one main surface and the other main surface, which are opposed to each other. Accordingly, since the signal path between the input side and the output side of the transmission power amplifier is capable of being shortened, it is possible to reduce the transmission loss of the radio-frequency signal.

In addition, the transmission power amplifier may have the ground electrode which has the first connection end and the second connection end, which are arranged in the direction vertical to the other main surface so as to be opposed to each other, and in which the second connection end is connected to the other main surface and the first connection end is connected to the external substrate.

With the above configuration, when the transmission power amplifier having a larger amount of heat generation is mounted on the mounting substrate, the other end of the ground electrode, which is the heat radiation path of the transmission power amplifier, is capable of being directly connected to the external substrate not via the plane wiring pattern and so on arranged on or in the mounting substrate. Accordingly, the heat radiation path through the plane wiring pattern having high thermal resistance, among the lines in the mounting substrate, is capable of being excluded. Consequently, it is possible to provide the compact radio-frequency module having the improved heat dissipation from the transmission power amplifier to the external substrate.

Second Embodiment

The arrangement configuration of multiple transmission power amplifiers in a radio-frequency module through which the radio-frequency signals in multiple communication bands are transmitted is described in a second embodiment.

[2.1 Circuit Configuration of Radio-Frequency Module 2 and Communication Apparatus 9]

Figure 9:
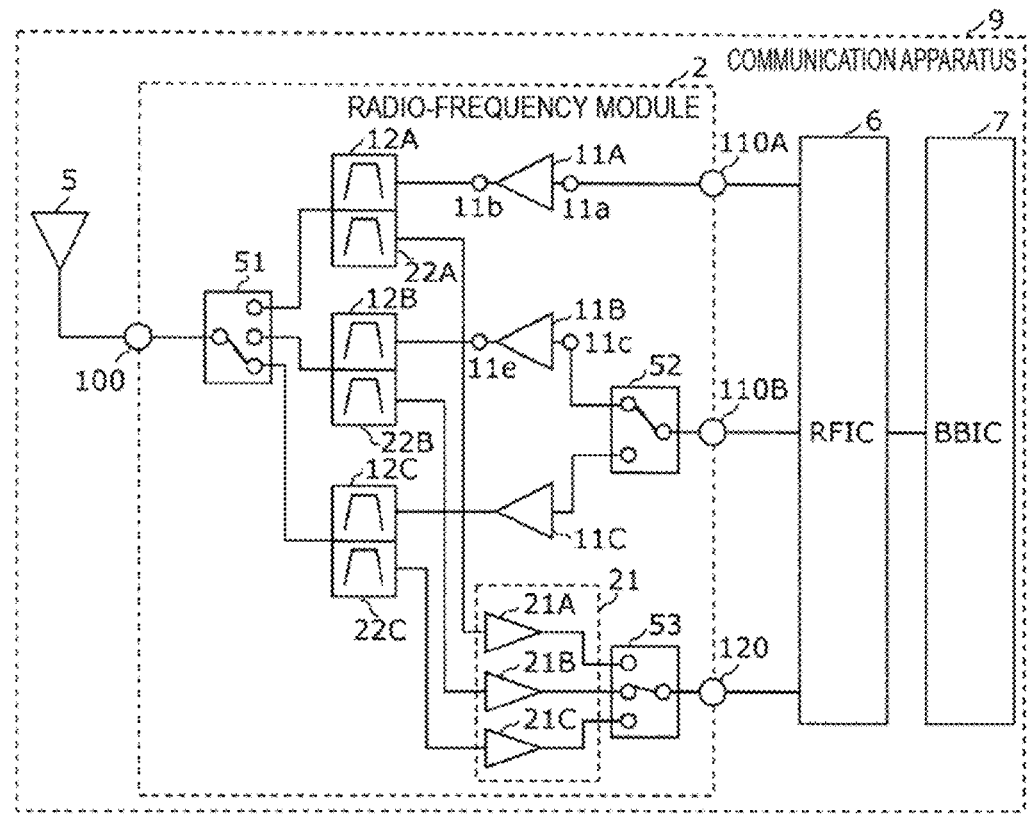
FIG. 9 is a circuit configuration diagram of a radio-frequency module and a communication apparatus according to a second embodiment.

FIG. 9 is a circuit configuration diagram of a radio-frequency module 2 and a communication apparatus 9 according to the second embodiment. Referring to FIG. 9, the communication apparatus 9 includes the radio-frequency module 2, the antenna element 5, the RF signal processing circuit (RFIC) 6, and the baseband signal processing circuit (BBIC) 7. The communication apparatus 9 according to the second embodiment differs from the communication apparatus 8 according to the first embodiment in the configuration of the radio-frequency module 2. A description of the same points of the communication apparatus 9 according to the second embodiment as in the communication apparatus 8 according to the first embodiment is omitted, and the communication apparatus 9 according to the second embodiment is described with a focus on points different from the communication apparatus 8 according to the first embodiment.

Referring to FIG. 9, the radio-frequency module 2 includes the common terminal 100, transmission input terminals 110A and 110B, the reception output terminal 120, PAs 11A, 11B, and 11C, LNAs 21A, 21B, and 21C, transmission filters 12A, 12B, and 12C, reception filters 22A, 22B, and 22C, and switches 51, 52, and 53.

The common terminal 100 is connected to the antenna element 5.

The PA 11A is the first transmission power amplifier that has the input electrode 11a and the output electrode 11b and that preferentially amplifies the radio-frequency signal, for example, in the first communication band. The PA 11B is a second transmission power amplifier that has an input electrode 11c and an output electrode 11e and that preferentially amplifies the radio-frequency signal, for example, in a second communication band lower than the first communication band. The PA 11C is a transmission power amplifier that preferentially amplifies the radio-frequency signal, for example, in a third communication band.

The LNA 21A is a reception low noise amplifier that preferentially amplifies the radio-frequency signal, for example, in the first communication band with low noise. The LNA 21B is a reception low noise amplifier that preferentially amplifies the radio-frequency signal, for example, in the second communication band with low noise. The LNA 21C is a reception low noise amplifier that preferentially amplifies the radio-frequency signal, for example, in the third communication band with low noise. The LNAs 21A to 21C may be incorporated in the LNA 21, which is a reception amplifier circuit.

Each of the PAs 11A to 11C and LNAs 21A to 21C is composed of, for example, a CMOS, a FET made of GaAs, or an HBT.

The transmission filter 12A is arranged on a transmission path connecting the PA 11A to the switch 51 and transmits the radio-frequency transmission signal in the transmission band of the first communication band, among the radio-frequency transmission signals amplified by the PA 11A. The transmission filter 12B is arranged on a transmission path connecting the PA 11B to the switch 51 and transmits the radio-frequency transmission signal in the transmission band of the second communication band, among the radio-frequency transmission signals amplified by the PA 11B. The transmission filter 12C is arranged on a transmission path connecting the PA 11C to the switch 51 and transmits the radio-frequency transmission signal in the transmission band of the third communication band, among the radio-frequency transmission signals amplified by the PA 11C.

The reception filter 22A is arranged on a reception path connecting the LNA 21A to the switch 51 and transmits the radio-frequency reception signal in the reception band in the first communication band, among the radio-frequency reception signals supplied from the common terminal 100. The reception filter 22B is arranged on a reception path connecting the LNA 21B to the switch 51 and transmits the radio-frequency reception signal in the reception band in the second communication band, among the radio-frequency reception signals supplied from the common terminal 100. The reception filter 22C is arranged on a reception path connecting the LNA 21C to the switch 51 and transmits the radio-frequency reception signal in the reception band in the third communication band, among the radio-frequency reception signals supplied from the common terminal 100.

In the second embodiment, the transmission filter 12A and the reception filter 22A compose a duplexer capable of concurrently transmitting and receiving the radio-frequency signal in the first communication band. The transmission filter 12B and the reception filter 22B compose a duplexer capable of concurrently transmitting and receiving the radio-frequency signal in the second communication band. The transmission filter 12C and the reception filter 22C compose a duplexer capable of concurrently transmitting and receiving the radio-frequency signal in the third communication band.

The switch 51 is arranged on a signal path connecting the common terminal 100 to the transmission filters 12A to 12C and the reception filters 22A to 22C and switches between (1) connection between the common terminal 100 and the transmission filter 12A and the reception filter 22A, (2) connection between the common terminal 100 and the transmission filter 12B and the reception filter 22B, and (3) connection between the common terminal 100 and the transmission filter 12C and the reception filter 22C. The switch 51 is composed of a multi-connection switch circuit capable of concurrently performing two or more connections in (1) to (3) described above.

The switch 52 is arranged on the transmission path connecting the transmission input terminal 110B to the PAs 11B and 11C and switches between connection between the transmission input terminal 110B and the PA 11B and connection between the transmission input terminal 110B and the PA 11C. The switch 52 is composed of, for example, a single pole double throw (SPDT) switch circuit in which a common terminal is connected to the transmission input terminal 110B, one selection terminal is connected to the PA 11B, and the other selection terminal is connected to the PA 11C.

The switch 53 is arranged on the reception path connecting the reception output terminal 120 and the LNA 21 and switches between (1) connection between the reception output terminal 120 and the LNA 21A, (2) connection between the reception output terminal 120 and the LNA 21B, and (3) connection between the reception output terminal 120 and the LNA 21C. The switch 53 is composed of, for example, a single pole triple throw (SP3T) switch circuit in which the common terminal is connected to the reception output terminal 120, a first selection terminal is connected to the LNA 21A, a second selection terminal is connected to the LNA 21B, and a third selection terminal is connected to the LNA 21C. The switch 53 is composed of a multi-connection switch circuit capable of concurrently performing two or more connections in (1) to (3) described above.

With the above circuit configuration, the radio-frequency module 2 according to the second embodiment is capable of performing at least one of concurrent transmission, concurrent reception, and concurrent transmission-and reception of the radio-frequency signal in the first communication band and the radio-frequency signal in either of the second communication band and the third communication band.

The PA 11C, the transmission filters 12A to 12C, the reception filters 22A to 22C, the LNAs 21A to 21C, the switches 51 to 53, and the reception output terminal 120 are not components essential for the radio-frequency modules according to the embodiments of the present disclosure. In this case, the radio-frequency module 2 is a system that transmits the radio-frequency signals in the first communication band and the second communication band.

The radio-frequency module 2 according to the second embodiment may be a circuit that transmits the radio-frequency signals not only in the three communication bands but also in four or more communication bands.

A configuration for improving the heat dissipation performance of the radio-frequency module 2 according to the second embodiment is described below.

[2.2 Arrangement Configuration of Circuit Elements in Radio-Frequency Module 2]

Figure 10:
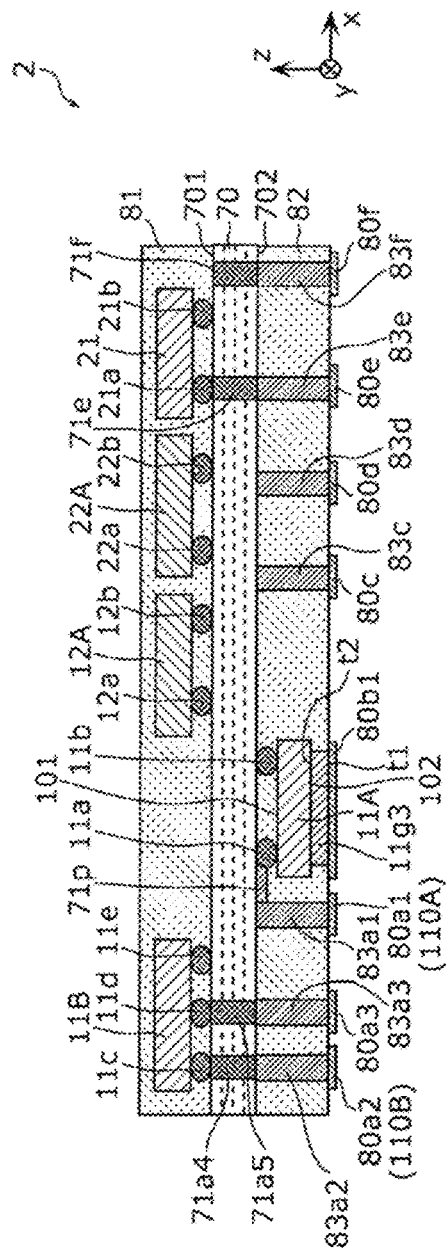
FIG. 10 is a diagram schematically illustrating the configuration of a cross section of the radio-frequency module according to the second embodiment.

FIG. 10 is a diagram schematically illustrating the configuration of a cross section of the radio-frequency module 2 according to the second embodiment. The radio-frequency module 2 illustrated in FIG. 10 is an exemplary structure in which the circuit configuration illustrated in FIG. 9 is realized as one module.

As illustrated in FIG. 10, the radio-frequency module 2 according to the second embodiment further includes the module substrate 70 and the resin members 81 and 82, in addition to the circuit configuration of the radio-frequency module 2 illustrated in FIG. 9. The PA 11C, the transmission filters 12B and 12C, the reception filters 22B and 22C, and the switches 51 to 53, among the circuit elements illustrated in FIG. 9, are not illustrated in the cross-sectional view in FIG. 10.

The radio-frequency module 2 illustrated in FIG. 10 differs from the radio-frequency module 1A illustrated in FIG. 2A in that the two transmission power amplifiers are arranged. A description of the same points of the radio-frequency module 2 according to the second embodiment as in the radio-frequency module 1A according to the first example is omitted, and the radio-frequency module 2 according to the second embodiment is described with a focus on points different from the radio-frequency module 1A according to the first example.

Referring to FIG. 10, in the radio-frequency module 2 according to the second embodiment, the PA 11B, the transmission filter 12A, the reception filter 22A, and the LNA 21 are surface-mounted on the main surface 701 of the module substrate 70. In contrast, the PA 11A is surface-mounted on the main surface 702 of the module substrate 70.

The radio-frequency module 2 further includes external connection electrodes 80a1, 80a2, 80a3, 80b1, 80c, 80d, 80e, and 80f formed on the outer surface (in the z-axis negative direction) of the resin member 82, connection electrodes (external connection terminals) 83a1, 83a2, and 83a3, and the plane wiring pattern 71p.

The transmission filter 12A has the input electrode 12a and the output electrode 12b connected to the module substrate 70. The reception filter 22A has the input electrode 22a and the output electrode 22b connected to the module substrate 70. The LNA 21 has the input electrode 21a and the output electrode 21b connected to the module substrate 70.

The external connection electrodes 80a1 is, for example, the transmission input terminal 110A (the hot terminal) through which the radio-frequency signal supplied from the RFIC 6 illustrated in FIG. 9 is transmitted. The external connection electrodes 80a2 is, for example, the transmission input terminal 110B (the hot terminal) through which the radio-frequency signal supplied from the RFIC 6 illustrated in FIG. 9 is transmitted.

The connection electrode 83a1 is a columnar electrode formed in the resin member 82 so as to extend in the direction vertical to the main surface 702. The external connection electrodes 80a1 is connected to the main surface 702 with the connection electrode 83a1 interposed therebetween.

The plane wiring pattern 71p is formed on the main surface 702 along the direction parallel to the main surface 702. The connection electrode 83a1 is connected to the input electrode 11a via the plane wiring pattern 71p.

The PA 11A is the first transmission power amplifier that has the main surface 101 (one main surface) and the main surface 102 (the other main surface), which are opposed to each other, and that is mounted on the main surface 702 so that the main surface 101 is opposed to the main surface 702. The PA 11A further includes the input electrode 11a, the output electrode 11b, and the ground electrode 11g3.

The input electrode 11a is the second input-output electrode which is connected to the main surface 101 and the main surface 702 and through which the radio-frequency signal through the external connection electrodes 80a1 and the connection electrode 83a1 is transmitted to the PA 11A.

The output electrode 11b is the first input-output electrode which is connected to the main surface 101 and the main surface 702 and through which the radio-frequency signal output from the PA 11A is transmitted to the module substrate 70.

The ground electrode 11g3 is the first ground electrode that is connected to the main surface 102 and the external connection electrode 80b1 and that sets the ground potential of the external substrate 90 for the PA 11A. The external connection electrode 80b1 is the first ground terminal that is arranged on the resin member 82 and that is connected to the ground electrode 11g3. More specifically, the ground electrode 11g3 has the connection end t1 (first connection end) and the connection end t2 (second connection end) that are arranged in the direction vertical to the main surface 102 so as to be opposed to each other. The connection end t2 is connected to the main surface 102 and the connection end t1 is connected to the external substrate 90 to transmit the ground potential of the external substrate 90 to the PA 11A. In other words, in the ground electrode 11g3, the direction connecting the connection end t2 joined to the main surface 102 to the connection end t1 joined to the external connection electrode 80b1 is vertical to the main surface 102.

The PA 11B is the second transmission power amplifier mounted on the main surface 701. The PA 11B has the input electrode 11c, the output electrode 11e, and a ground electrode 11d.

The input electrode 11c is an input-output electrode which is connected to the main surface 701 and through which the radio-frequency signal through the external connection electrodes 80a2 and the connection electrode 83a2 is transmitted to the PA 11B. The output electrode 11e is an input-output electrode which is connected to the main surface 701 and through which the radio-frequency signal output from the PA 11B to the module substrate 70.

The ground electrode 11d is a second ground electrode that is connected to the main surface 701 and that sets the ground potential of the external substrate 90 for the PA 11B.

The PA 11A includes, for example, a transistor element including a base terminal, a collector terminal, and an emitter terminal, a bias circuit, the input electrode 11a, and the output electrode 11b. The transistor element includes, for example, a collector, an emitter, and a base, is an emitter-grounded bipolar transistor, and amplifies high-frequency current input into the base to output the amplified high-frequency current from the collector. The bias circuit is connected to the base of the transistor element and has a function to apply bias voltage to the base to optimize the operating point of the transistor element. The radio-frequency signal input through the input electrode 11a flows from the base of the transistor element to the emitter thereof as base current Ib1. The base current Ib1 is amplified by the transistor element to be collector current Ic1 and the radio-frequency signal corresponding to the collector current Ic1 is output through the output electrode 11b. At this time, high current resulting from combination of the base current Ib1 with the collector current Ic1 flows from the emitter terminal to the ground.

The PA 11B includes, for example, a transistor element including a base terminal, a collector terminal, and an emitter terminal, a bias circuit, the input electrode 11c, and the output electrode 11e. The transistor element includes, for example, a collector, an emitter, and a base, is an emitter-grounded bipolar transistor, and amplifies high-frequency current input into the base to output the amplified high-frequency current from the collector. The bias circuit is connected to the base of the transistor element and has a function to apply bias voltage to the base to optimize the operating point of the transistor element. The radio-frequency signal input through the input electrode 11c flows from the base of the transistor element to the emitter thereof as base current Ib2. The base current Ib2 is amplified by the transistor element to be collector current Ic2 and the radio-frequency signal corresponding to the collector current Ic2 is output through the output electrode 11e. At this time, high current resulting from combination of the base current Ib2 with the collector current Ic2 flows from the emitter terminal to the ground.

The ground electrode 11g3 is the emitter terminal of the PA 11A and the ground electrode 11d is the emitter terminal of the PA 11B.

The radio-frequency module 2 further includes through vias 71a4 and 71a5. The through via 71a4 is a via conductor that is connected to the input electrode 11c and the external connection electrodes 80a2 (via the connection electrode 83a2) and that passes through the module substrate 70 from the main surface 701 to the main surface 702. The through via 71a5 is a via conductor that is connected to the ground electrode 11d and the external connection electrode 80a3 (via the connection electrode 83a3) and that passes through the module substrate 70 from the main surface 701 to the main surface 702. The external connection electrode 80a3 is a second ground terminal that is arranged at the main surface 702 side with respect to the module substrate 70 and that is electrically connected to the external substrate 90.

In the above configuration of the radio-frequency module 2, since the PA 11A and the PA 11B, which are concurrently used, are distributed to the main surface 702 and the main surface 701 of the module substrate 70, it is possible to ensure the isolation between the radio-frequency signal in the first communication band and the radio-frequency signal in the second communication band in the concurrent transmission (collision avoidance (CA)). In addition, the PA 11A that amplifies the radio-frequency signal in the first communication band requiring the output higher than that of the second communication band is mounted on the main surface 702 closer to the external substrate 90, among the main surfaces 701 and 702, and the ground electrode 11g3, which is the heat radiation path of the PA 11A, is connected to the external substrate 90 (via the external connection electrode 80b1). Accordingly, even in the configuration in which the PA 11A is mounted on the main surface 702 closer to the external substrate 90, the heat radiation path through the plane wiring pattern having high thermal resistance, among the lines in the module substrate 70, is capable of being excluded.

In addition, since the PA 11B is mounted on the main surface 701 and the ground electrode 11d is connected to the external connection electrode 80a3 via the through via 71a5 formed in the module substrate 70, the heat radiation path only through the plane wiring pattern having high thermal resistance, among the lines in the module substrate 70, is capable of being excluded. Consequently, it is possible to improve the heat dissipation from the PA 11B to the external substrate 90.

With the above configuration, it is possible to provide the compact radio-frequency module 2 having the improved heat dissipation from the PA 11A and the PA 11B to the external substrate 90.

Other Embodiments

Although the radio-frequency modules and the communication apparatuses according to the first and second embodiments of the present disclosure are described above, the radio-frequency modules and the communication apparatuses of the present disclosure are not limited to the above embodiments. Other embodiments realized by combining arbitrary components in the above embodiments, modifications realized by making various changes supposed by a person skilled in the art to the above embodiments without departing from the spirit and scope of the present disclosure, and various devices including the radio-frequency module and the communication apparatus are also included in the present disclosure.

For example, in the radio-frequency modules and the communication apparatuses according to the first and second embodiments, other circuit elements, lines, and so on may be provided between the paths with which the respective circuit elements and the signal paths illustrated in the drawings are connected.

The configuration is described in the second embodiment, in which the first transmission power amplifier (the PA 11A) and the second transmission power amplifier (the PA 11B) are separately arranged on both faces (the main surfaces 701 and 702) of the mounting substrate (the module substrate 70). In contrast, the radio-frequency module of the present disclosure may have a configuration in which both the first transmission power amplifier (the PA 11A) and the second transmission power amplifier (the PA 11B) are arranged on the main surface (the main surface 702) opposed to the external substrate 90, among the main surfaces of the mounting substrate (the module substrate 70). Furthermore, the radio-frequency module of the present disclosure may have a configuration in which the first transmission power amplifier (the PA 11A) and the second transmission power amplifier (the PA 11B) are formed on one chip and the chip is arranged on the main surface (the main surface 702) opposed to the external substrate 90, among the main surfaces of the mounting substrate (the module substrate 70).

The present disclosure is widely usable for a communication device, such as a mobile phone, as a compact radio-frequency module arranged in a front end unit.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A radio-frequency module comprising:
a mounting substrate having a first main surface and a second main surface on opposite sides of the mounting substrate;
an external connection terminal arranged on the first main surface; and
a first transmission power amplifier arranged on the first main surface,
wherein the first transmission power amplifier includes
an amplifier first main surface closest to the first main surface,
an amplifier second main surface that faces away from the amplifier first main surface,
a first input-output electrode arranged on the amplifier first main surface and through which a radio-frequency signal input into the first transmission power amplifier or a radio-frequency signal output from the first transmission power amplifier is transmitted, and
a first ground electrode arranged on the amplifier second main surface.

2. The radio-frequency module according to claim 1,
wherein the first main surface and the amplifier first main surface are opposed to each other with the first input-output electrode interposed therebetween,
wherein the first ground electrode has a first connection end and a second connection end arranged on opposite sides of the first ground electrode and in a direction vertical to the amplifier second main surface,
wherein the second connection end is connected to the amplifier second main surface, and
wherein the first connection end is connectable to an external substrate.

3. The radio-frequency module according to claim 1, further comprising:
an external connection electrode arranged on an outer surface of the radio-frequency module at the first main surface side with respect to the mounting substrate,
wherein the first transmission power amplifier further includes
a second input-output electrode that has a third connection end and a fourth connection end arranged on opposite sides of the second input-output electrode and in a direction vertical to the amplifier second main surface, the fourth connection end being connected to the amplifier second main surface and the third connection end being connected to the external connection electrode to transmit a radio-frequency signal supplied from the external connection electrode to the first transmission power amplifier, and
wherein the first input-output electrode is a terminal through which a radio-frequency signal amplified by the first transmission power amplifier is output from the first transmission power amplifier.

4. The radio-frequency module according to claim 1, further comprising:
an external connection electrode arranged on an outer surface of the radio-frequency module at the first main surface side with respect to the mounting substrate,
wherein the external connection electrode is connected to the first main surface with the external connection terminal interposed therebetween,
wherein the first transmission power amplifier further includes
a second input-output electrode which is connected to the amplifier first main surface and the first main surface and through which a radio-frequency signal via the external connection electrode and the external connection terminal is transmitted to the first transmission power amplifier, and
wherein the first input-output electrode is a terminal configured to output a radio-frequency signal amplified by the first transmission power amplifier from the first transmission power amplifier.

5. The radio-frequency module according to claim 4,
wherein, in a plan view of the amplifier first main surface and the amplifier second main surface, an area of the first ground electrode is greater than a combined area of the first input-output electrode and the second input-output electrode.

6. The radio-frequency module according to claim 3, further comprising:
a resin member formed on the first main surface and covers at least part of the first transmission power amplifier; and
a first ground terminal arranged on the resin member and that is connected to the first ground electrode,
wherein the external connection electrode is arranged on the resin member.

7. The radio-frequency module according to claim 1,
wherein the first input-output electrode is a terminal that outputs a radio-frequency signal amplified by the first transmission power amplifier from the first transmission power amplifier, the radio-frequency module further comprising:
a transmission filter mounted on the mounting substrate and having an input end connected to the first input-output electrode.

8. The radio-frequency module according to claim 7, wherein
the transmission filter is mounted on the second main surface, and
the first transmission power amplifier and the transmission filter are at least partially overlapped with each other in a plan view of the mounting substrate.

9. The radio-frequency module according to claim 8,
wherein the first input-output electrode of the first transmission power amplifier is connected to the input end of the transmission filter via a via conductor that passes through the mounting substrate in a direction vertical to the first main surface and the second main surface.

10. The radio-frequency module according to claim 7,
wherein the transmission filter is mounted on the first main surface.

11. The radio-frequency module according to claim 7, further comprising:
a low noise amplifier mounted on the second main surface,
wherein the first transmission power amplifier does not overlap the low noise amplifier in a plan view of the mounting substrate.

12. The radio-frequency module according to claim 11, further comprising:
a reception filter mounted on the mounting substrate and having an output end connected to an input end of the low noise amplifier.

13. The radio-frequency module according to claim 12, wherein
the first transmission power amplifier is mounted on the first main surface,
the low noise amplifier is mounted on the second main surface,
the reception filter is mounted on the first main surface, and in a plan view of the mounting substrate, the first transmission power amplifier and the transmission filter are arranged in a first area and the low noise amplifier and the reception filter are arranged in a second area that does not overlap the first area.

14. The radio-frequency module according to claim 12, further comprising:
a transmission matching circuit arranged on a path that connects the first input-output electrode to an input end of the transmission filter and configured to provide impedance matching between the first transmission power amplifier and the transmission filter; and
a reception matching circuit arranged on a path that connects an input terminal of the low noise amplifier to an output end of the reception filter and configured to provide impedance matching between the low noise amplifier and the reception filter,
wherein, in a plan view of the mounting substrate, at least one of the first transmission power amplifier, the low noise amplifier, the transmission filter, and the reception filter is arranged between the transmission matching circuit and the reception matching circuit.

15. The radio-frequency module according to claim 14, wherein the transmission matching circuit and the reception matching circuit are mounted on the second main surface.

16. The radio-frequency module according to claim 1, wherein the first transmission power amplifier is a heterojunction bipolar transistor including a base terminal, a collector terminal, and an emitter terminal, and
wherein the first ground electrode is the emitter terminal of the first transmission power amplifier.

17. The radio-frequency module according to claim 1, wherein
the first transmission power amplifier amplifies a radio-frequency signal in a first communication band, and
the radio-frequency module is connectable to an external substrate, the radio-frequency module further comprises
a second transmission power amplifier mounted on the second main surface and that amplifies a radio-frequency signal in a second communication band lower in frequency than the first communication band,
a second ground terminal arranged at the first main surface side with respect to the mounting substrate and that is electrically connected to the external substrate, wherein the second transmission power amplifier includes a second ground electrode connected to the second main surface, and
a through via that is connected to the second ground electrode and the second ground terminal and that passes through the mounting substrate from the second main surface to the first main surface,
wherein the radio-frequency signal in the first communication band and the radio-frequency signal in the second communication band are concurrently transmitted.

18. The radio-frequency module according to claim 17, wherein
the second transmission power amplifier is a heterojunction bipolar transistor including a base terminal, a collector terminal, and an emitter terminal, and
the second ground electrode is the emitter terminal of the second transmission power amplifier.

19. A transmission power amplifier comprising:
an amplifier first main surface and an amplifier second main surface on opposites sides of the transmission power amplifier from one another;
a first input-output electrode connected to the amplifier first main surface and through which a radio-frequency signal input into the transmission power amplifier or a radio-frequency signal output from the transmission power amplifier is transmitted;
a second input-output electrode connected to the amplifier second main surface and through which a radio-frequency signal input into the transmission power amplifier or a radio-frequency signal output from the transmission power amplifier is transmitted; and
a ground electrode arranged on the amplifier second main surface.

20. A communication apparatus comprising:
an antenna element;
a radio-frequency signal processing circuit that processes a radio-frequency signal transmitted and received through the antenna element; and
a radio-frequency module configured to transmit the radio-frequency signal between the antenna element and the radio-frequency signal processing circuit, the radio-frequency module includes
a mounting substrate having a first main surface and a second main surface on opposite sides of the mounting substrate,
an external connection terminal arranged on the first main surface, and
a first transmission power amplifier arranged on the first main surface, wherein
the first transmission power amplifier includes
an amplifier first main surface closest to the first main surface,
an amplifier second main surface that faces away from the amplifier first main surface,
a first input-output electrode arranged on the amplifier first main surface and through which a radio-frequency signal input into the first transmission power amplifier or a radio-frequency signal output from the first transmission power amplifier is transmitted, and
a first ground electrode arranged on the amplifier second main surface.

* * * * *